(12) United States Patent
Lee et al.

(10) Patent No.: US 11,730,010 B2
(45) Date of Patent: Aug. 15, 2023

(54) DISPLAY DEVICE WITH ISLAND-SHAPE SPACERS IN NON-DISPLAY AREA

(71) Applicant: SAMSUNG DISPLAY CO., LTD., Yongin-si (KR)

(72) Inventors: Wonse Lee, Yongin-si (KR); Yunkyeong In, Yongin-si (KR); Sukyoung Kim, Yongin-si (KR); Youngsoo Yoon, Yongin-si (KR); Donghyeon Jang, Yongin-si (KR); Yujin Jeon, Yongin-si (KR); Hyunji Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 401 days.

(21) Appl. No.: 17/010,009

(22) Filed: Sep. 2, 2020

(65) Prior Publication Data

US 2021/0066642 A1     Mar. 4, 2021

(30) Foreign Application Priority Data

Sep. 3, 2019    (KR) .................. 10-2019-0108939

(51) Int. Cl.
*H10K 50/842*     (2023.01)
*H10K 50/86*      (2023.01)
(Continued)

(52) U.S. Cl.
CPC ......... *H10K 50/8428* (2023.02); *H10K 50/86* (2023.02); *H10K 59/124* (2023.02);
(Continued)

(58) Field of Classification Search
CPC .............. H01L 51/525; H01L 51/5281; H01L 27/3258; H01L 27/3276; H01L 27/3211;
(Continued)

(56) References Cited

U.S. PATENT DOCUMENTS 9,632,487 B2   4/2017   Kim et al.
9,947,734 B2   4/2018   You et al.
(Continued)

FOREIGN PATENT DOCUMENTS

KR        10-1406129      6/2014
KR   10-2017-0015632    2/2017
(Continued)

*Primary Examiner* — Lex H Malsawma
(74) *Attorney, Agent, or Firm* — F Chau & Associates, LLC

(57) ABSTRACT

A display device includes a first substrate, an insulating layer, a plurality of display elements, a plurality of first spacers, and a second substrate. The first substrate includes a transmission area, a display area surrounding at least a portion of the transmission area, and a first non-display area located between the transmission area and the display area. The insulating layer is arranged on the first substrate in the display area and the first non-display area. The plurality of display elements are disposed on the insulating layer in the display area. The plurality of first spacers each has an island shape and are spaced apart from each other on the insulating layer in the first non-display area. The second substrate faces the first substrate.

22 Claims, 25 Drawing Sheets

(51) Int. Cl.
  *H10K 59/124* (2023.01)
  *H10K 59/131* (2023.01)
  *G06F 3/044* (2006.01)
  *G06F 3/041* (2006.01)
  *H04N 23/57* (2023.01)
  *H10K 59/35* (2023.01)

(52) U.S. Cl.
  CPC ......... *H10K 59/131* (2023.02); *G06F 3/0412* (2013.01); *G06F 3/0446* (2019.05); *G06F 2203/04111* (2013.01); *H04N 23/57* (2023.01); *H10K 59/35* (2023.02)

(58) Field of Classification Search
  CPC .... H04N 5/2257; H04N 23/57; G06F 3/0446; G06F 3/0412; G06F 2203/04111; H10K 50/8428; H10K 50/86; H10K 59/131; H10K 59/124; H10K 59/35
  See application file for complete search history.

(56) References Cited

U.S. PATENT DOCUMENTS

| | | | |
|---|---|---|---|
| 10,281,772 B2 | 5/2019 | Chen et al. | |
| 10,686,022 B2* | 6/2020 | Lee | H01L 27/3246 |
| 2005/0140290 A1* | 6/2005 | Park | H01L 27/3253 |
| | | | 313/506 |
| 2010/0097295 A1* | 4/2010 | Kwak | H01L 51/5284 |
| | | | 345/32 |
| 2010/0207107 A1* | 8/2010 | Kim | H01L 51/525 |
| | | | 257/E33.044 |
| 2013/0258234 A1 | 10/2013 | Park et al. | |
| 2016/0035803 A1* | 2/2016 | Kim | H01L 27/3246 |
| | | | 438/34 |
| 2016/0035980 A1* | 2/2016 | Kong | H01L 51/5234 |
| | | | 438/26 |
| 2016/0064411 A1 | 3/2016 | Park et al. | |
| 2016/0233458 A1* | 8/2016 | Shen | H01L 27/3211 |
| 2016/0254476 A1 | 9/2016 | Park | |
| 2018/0342700 A1* | 11/2018 | Cai | H01L 51/5206 |
| 2019/0074479 A1 | 3/2019 | Lee et al. | |
| 2019/0165063 A1* | 5/2019 | Lee | H01L 51/5228 |
| 2019/0187849 A1* | 6/2019 | Lee | G06F 3/0412 |
| 2019/0245020 A1 | 8/2019 | Choi et al. | |
| 2019/0348633 A1 | 11/2019 | Lee et al. | |
| 2021/0226155 A1* | 7/2021 | Li | H01L 27/3276 |

FOREIGN PATENT DOCUMENTS

| | | |
|---|---|---|
| KR | 10-2017-0078909 | 7/2017 |
| KR | 10-1801343 | 11/2017 |
| KR | 10-2019-0027003 | 3/2019 |

* cited by examiner

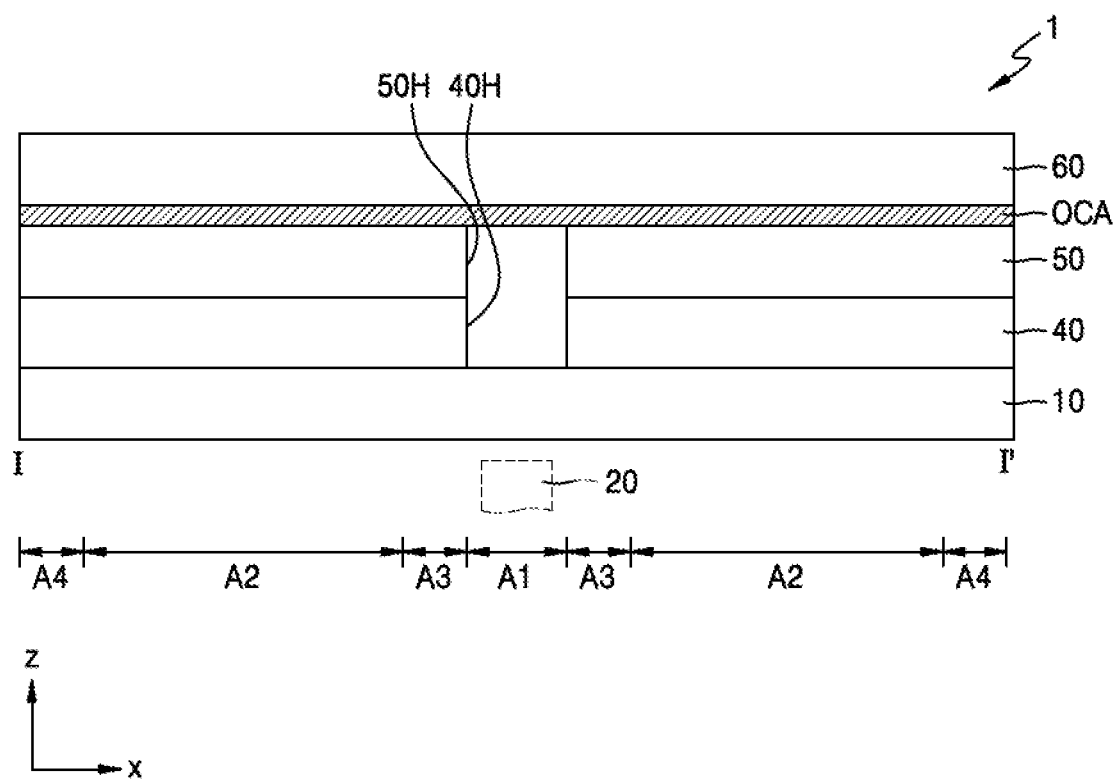

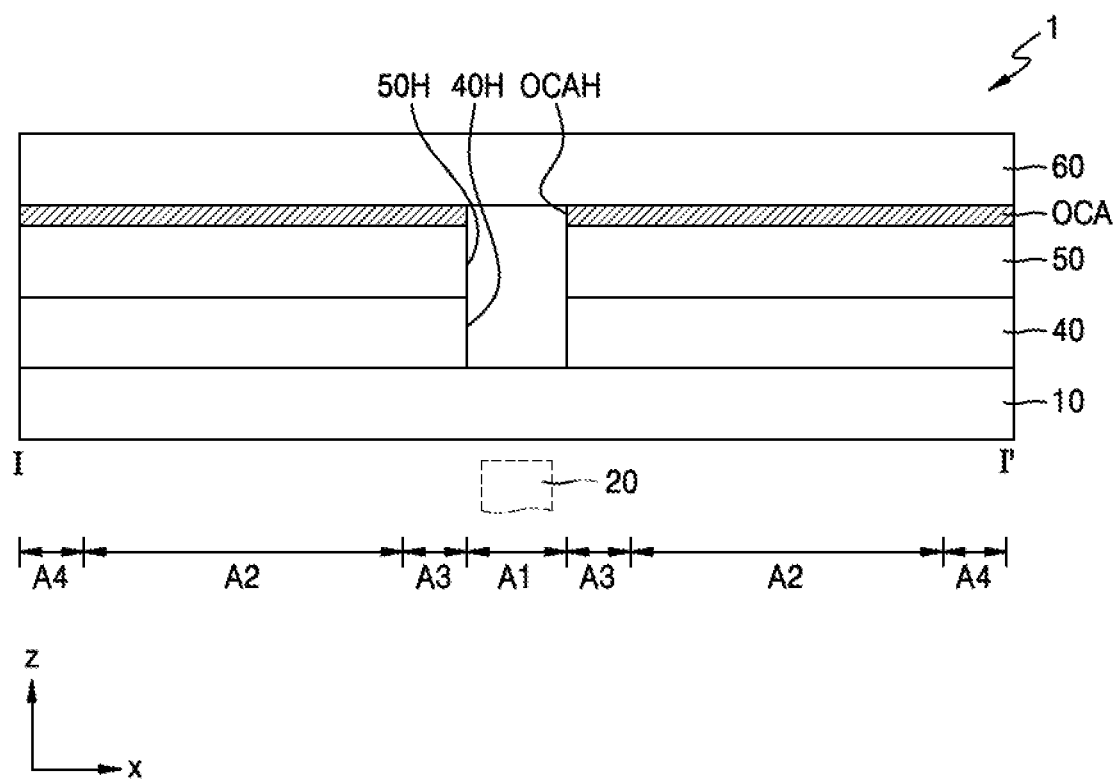

FIG. 7
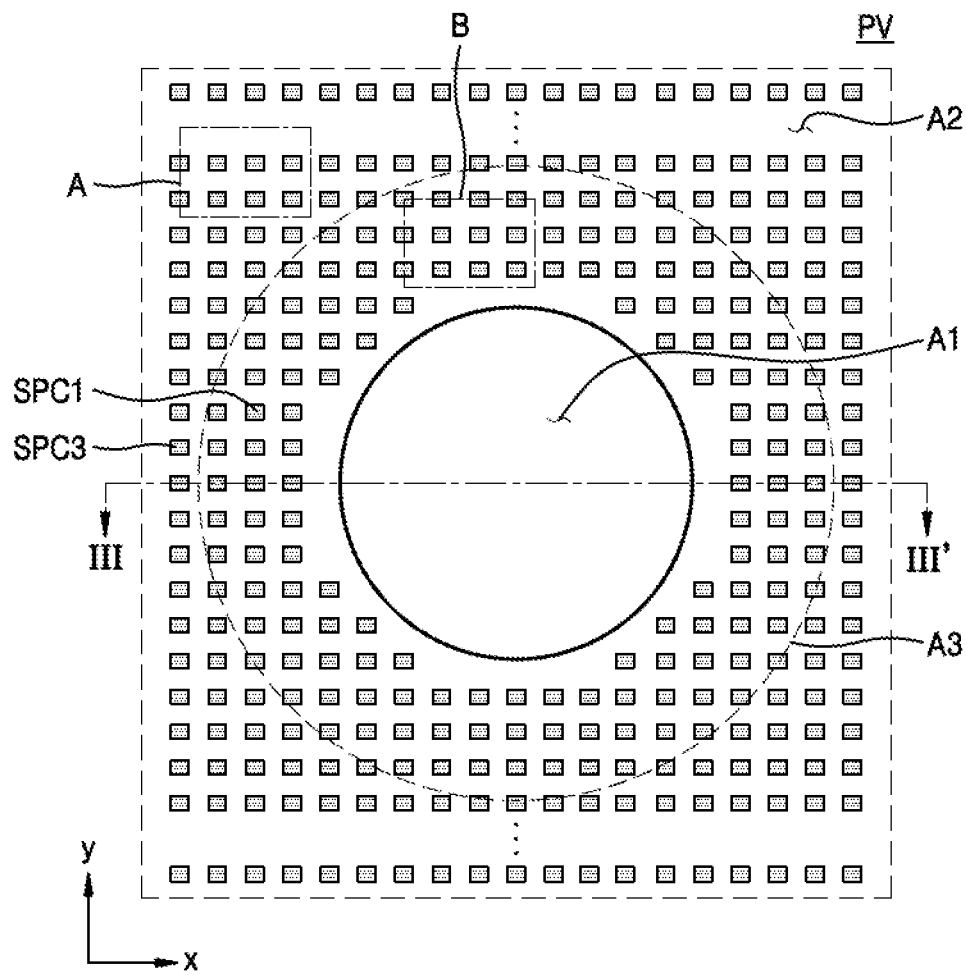
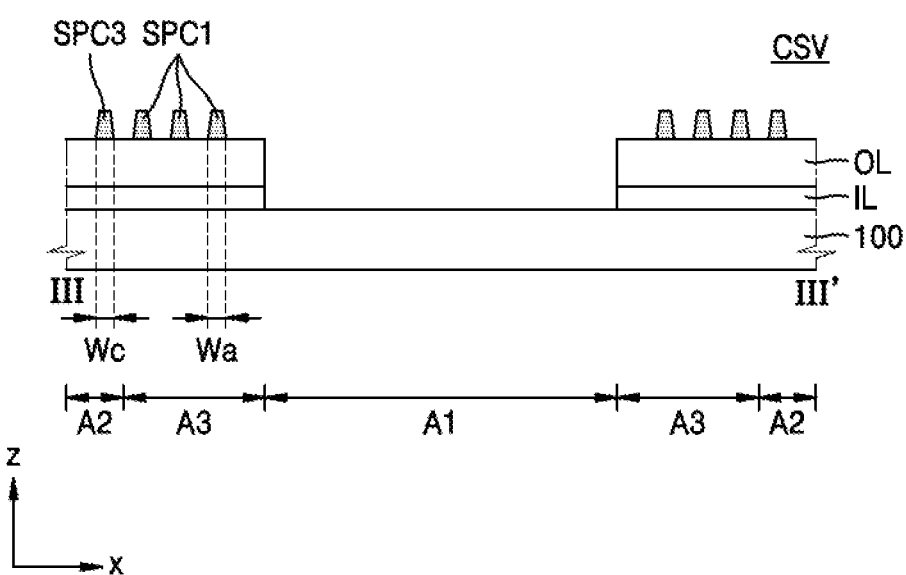

DISPLAY DEVICE WITH ISLAND-SHAPE SPACERS IN NON-DISPLAY AREA

CROSS-REFERENCE TO RELATED APPLICATION

This application claims the benefit under 35 U.S.C. § 119 of Korean Patent Application No. 10-2019-0108939, filed on Sep. 3, 2019, in the Korean Intellectual Property Office, the disclosure of which is incorporated by reference herein in its entirety.

TECHNICAL FIELD

Exemplary embodiments of the present disclosure relate to a display device, and more particularly, to a display device including a transmission area.

DISCUSSION OF RELATED ART

Applications of display devices have recently become more diversified. Also, as the display devices become thinner and lighter, their use has expanded to a wide range of electronic products. At the same time, as the area occupied by display areas of the display devices increases, various functions applied or linked to the display devices may be added. To increase the area occupied by a display area and also add various functions, research has been carried out on display devices having, within a display area, an area for adding various functions other than image display.

SUMMARY

Exemplary embodiments of the present disclosure include a high-quality display device including, within a display area, a transmission area capable of transmitting light as an area for adding various functions. However, the exemplary embodiments are only examples, and the scope of the present disclosure is not limited thereto.

Additional aspects will be set forth in part in the description which follows and, in part, will be apparent from the description, or may be learned by practice of the presented exemplary embodiments of the present disclosure.

According to an exemplary embodiment of the present disclosure, a display device includes a first substrate, an insulating layer, a plurality of display elements, a plurality of first spacers, and a second substrate. The first substrate includes a transmission area, a display area surrounding at least a portion of the transmission area, and a first non-display area located between the transmission area and the display area. The insulating layer is arranged on the first substrate in the display area and the first non-display area. The plurality of display elements are disposed on the insulating layer in the display area. The plurality of first spacers each has an island shape and are spaced apart from each other on the insulating layer in the first non-display area. The second substrate faces the first substrate.

The insulating layer may include at least one inorganic insulating layer and at least one organic insulating layer, and the at least one organic insulating layer may be on the at least one inorganic insulating layer.

Each of the display elements may include a first electrode, a second electrode facing the first electrode, and an emission layer disposed between the first electrode and the second electrode, and a pixel defining layer located between the first electrodes of the display elements may be arranged on the at least one organic insulating layer.

The plurality of first spacers may be on the pixel defining layer arranged in the first non-display area.

The second electrode may cover the pixel defining layer and the plurality of first spacers.

The plurality of first spacers may include an organic insulative material.

The display device may further include a second spacer arranged on the insulating layer in the first non-display area and having a ring shape that surrounds the transmission area.

The second spacer may be located adjacent to the transmission area, and the plurality of first spacers may be arranged around the second spacer.

The second spacer may include an organic insulative material.

The display device may further include a plurality of third spacers that are located on the insulating layer in the display area, each has an island shape, and are arranged between the plurality of display elements.

The display device may further include a sealant that couples the first substrate to the second substrate and is arranged on the first substrate in a second non-display area that surrounds the display area.

The display device may further include a metal layer provided on the second substrate and overlapping the plurality of first spacers.

The second substrate may have a trench located to correspond to the transmission area, and the trench is formed as a dented area of the second substrate on a surface that faces the first substrate.

According to an exemplary embodiment of the present disclosure, a display device includes a first substrate, a first electrode, an insulating layer, a plurality of first spacers, an emission layer, and a second electrode. The first substrate includes a transmission area, a display area surrounding at least a portion of the transmission area, and a first non-display area located between the transmission area and the display area. The first electrode is arranged in the display area on the first substrate. The insulating layer is arranged in the display area and the first non-display area on the first substrate, and includes an opening exposing a portion of the first electrode in the display area and also includes a through hole corresponding to the transmission area. The plurality of first spacers are located on the insulating layer in the first non-display area, each has an island shape, and are arranged around the through hole along a circumference of the through hole. The emission layer is disposed within the opening of the insulating layer. The second electrode faces the first electrode in the display area and covers the plurality of first spacers in the first non-display area.

The plurality of first spacers may include an organic insulative material.

The display device may further include a second spacer arranged on the insulating layer in the first non-display area and having a ring shape that surrounds the transmission area, in which the second spacer may be between the through hole and the plurality of first spacers.

The second spacer may include an organic insulative material.

The display device may further include a second substrate facing the first substrate.

The display device may further include a metal layer provided on the second substrate and overlapping the plurality of first spacers.

The second substrate may have a trench located to correspond to the transmission area, on a surface, that faces the first substrate, of the second substrate.

According to an exemplary embodiment of the present disclosure, a display device includes a first substrate, a first electrode, an insulating layer, a plurality of detouring wires, a plurality of first spacers, a second electrode, and a metal layer. The first substrate includes a transmission area, a display area surrounding at least a portion of the transmission area, and a first non-display area located between the transmission area and the display area. The insulating layer is formed on the first substrate and arranged in the display area and the first non-display area. The plurality of detouring wires are disposed in the insulating layer in the first non-display area. The plurality of first spacers each having an island shape are spaced apart from each other on the insulating layer in the first non-display area. The second substrate faces the first substrate. The metal layer is provided on the second substrate and overlapping the plurality of first spacers and the plurality of detouring wires, with the metal layer configured to prevent external light incident via the transmission area from reaching the plurality of detouring wires.

The display device may further include a trench formed as a dented area of the second substrate on a surface facing the first substrate, in which the trench is located to correspond to the transmission area, and does not overlap the plurality of first spacers.

BRIEF DESCRIPTION OF THE DRAWINGS

The above and other aspects and features of the present disclosure will be more apparent from the following description taken in conjunction with the accompanying drawings, in which:

FIGS. 2A and 2B are schematic cross-sectional views of a display device according to an exemplary embodiment of the present disclosure;

FIG. 7 schematically illustrates a portion of a display panel according to an exemplary embodiment of the present disclosure;

Figure 1A:
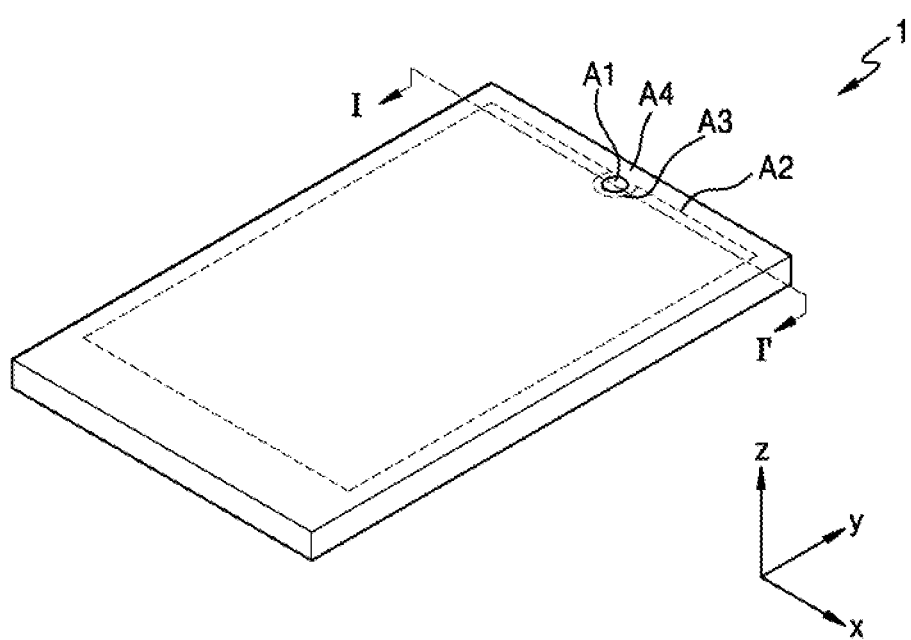
FIGS. 1A and 1B are schematic perspective views of a display device according to an exemplary embodiment of the present disclosure.

Since the drawings in FIGS. 1-20 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to exemplary embodiments of the present disclosure, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first", "second", etc. may be used herein to describe various elements, these elements should not be limited by these terms. These terms are only used to distinguish one element from another.

As used herein, the singular forms "a", "an" and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

In the present specification, "A and/or B" represents A or B, or A and B. The expression "at least one of A and B" indicates only A, only B, both A and B, or variations thereof.

In the following exemplary embodiments, the meaning that a wire extends in a first direction or a second direction encompasses not only extending in a straight line but also extending in zigzags or in a curve in the first direction or the second direction.

In the following exemplary embodiments, when referred to "planar" it means when an object is viewed from above, and when referred to "cross-sectional" it means when a cross section formed by vertically cutting an object is viewed from the side. In the following exemplary embodiments, when referred to "overlapping" it encompasses "planar" overlapping and/or "cross-sectional" overlapping. However, in general, the term "overlap" means overlapping in a direction perpendicular to the top surface of the substrate.

Figure 1B:
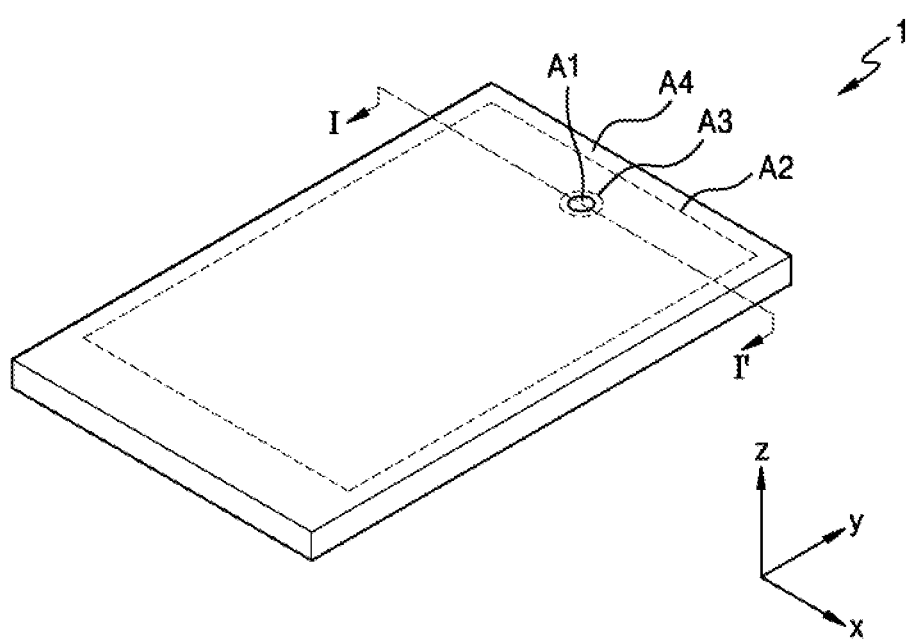

FIGS. 1A and 1B are schematic perspective views of a display device 1 according to an exemplary embodiment of the present disclosure.

Referring to FIG. 1A, the display device 1 may include a first area A1 and a second area A2 surrounding at least a portion of the first area A1. In the second area A2, a plurality of pixels, for example, an array of pixels, may be arranged, and an image may be displayed via the array of pixels. According an exemplary embodiment of the present disclosure, the plurality of pixels may be arranged in a matrix shape, but the present disclosure is not limited thereto. For example, the plurality of pixels may be arranged in a pentile matrix shape, or a diamond shape. The second area A2 may correspond to a display area capable of displaying an image. At least a portion of the first area A1 may be surrounded by the second area A2. As shown in FIG. 1A, a portion of the first area A1 is not surrounded by the second area A2. According to an exemplary embodiment of the present disclosure, as shown in FIG. 1B, the first area A1 may be entirely surrounded by the second area A2. In the first area A1, a component may be arranged as an electronic element capable of providing various functions to the display device 1. The first area A1 may be a transmission area capable of transmitting light and/or sound that is output from the component to the outside or travels from the outside toward the component. For example, when the component includes a sensor or camera using light, the first area A1 may be a transmission area capable of transmitting light of the sensor or light that travels toward the camera.

A third area A3 may be disposed between the first area A1 and the second area A2. The third area A3 may be a non-display area in which no pixels are arranged. Like the third area A3, a fourth area A4 surrounding the second area A2 may also be a non-display area in which no pixels are arranged. In the fourth area A4, various types of wires, a circuit, and the like may be arranged. As shown in FIG. 1A, the third area A3 may be connected to the fourth area A4. As shown in FIG. 1B, the third area A3 may be an independent area not connected to the fourth area A4. For example, as shown in FIG. 1B, the third area A3 may be entirely surrounded by the second area A2, the second area A2 may be entirely surrounded by the fourth area A4, and the first area A1 may be entirely surrounded by the third area A3.

Each of a plurality of pixels included in the display device 1 may include a light-emitting diode as a display element capable of emitting light of a certain color. The light-emitting diode may include an organic light-emitting diode including an organic material as an emission layer. Alternatively, the light-emitting diode may include an inorganic light-emitting diode. Alternatively, the light-emitting diode may include quantum dots and/or quantum rods as an emission layer. For convenience of explanation, a case where the light-emitting diode includes an organic light-emitting diode will now be described.

Although the first area A1 is arranged at a center portion of the second area A2 in a width direction (e.g., x direction) of the display device 1 in FIGS. 1A and 1B, the present disclosure is not limited thereto. Here, the x direction includes both positive and negative directions, not just the arrow direction of x shown in FIGS. 1A and 1B. According to an exemplary embodiment of the present disclosure, the first area A1 may be arranged to be offset to the left or right side in the width direction (e.g., x direction) of the display device 1. The first area A1 may be arranged at various locations, like being arranged on an upper side, a center, or a lower side in a length direction (e.g., y direction) of the display device 1. Here, the y direction includes both positive and negative directions, not just the arrow direction of y shown in FIGS. 1A and 1B.

In FIGS. 1A and 1B, the display device 1 includes a single first area A1. However, according to an exemplary embodiment of the present disclosure, the display device 1 may include a plurality of first areas A1. The shape, size, and location of the first area A1 may vary. For example, according to an exemplary embodiment of the present disclosure, the shape of the first area A1 may be modified in various ways such as, for example, a circular shape, an elliptical shape, a polygonal shape, a star shape, or a diamond shape. When two or more first areas A1 are provided, the first areas A1 may have the same shape or different shapes, and may have the same size or different sizes.

FIGS. 2A and 2B are schematic cross-sectional views of the display device 1 according to an exemplary embodiment of the present disclosure, and may each correspond to a cross-section taken along line I-I' of FIGS. 1A and 1B.

Referring to FIG. 2A, the display device 1 may include a display panel 10, an input sensing layer 40, and an optical functional layer 50 sequentially arranged on the display panel 10. The display panel 10, the input sensing layer 40, and the optical functional layer 50 may be covered by a window 60. The window 60 may be coupled to an element below the window 60, for example, the optical functional layer 50, via an adhesion layer (such as, an optical clear adhesive (OCA)). The display device 1 may be included in any of various electronic apparatuses such as, for example, mobile phones, tablet personal computers (PCs), notebook computers, and smartwatches.

The display panel 10 may display an image, and may include a plurality of diodes arranged in the second area A2. The input sensing layer 40 may obtain coordinate information according to an external input, for example, a touch event. The input sensing layer 40 may include a sensing electrode (or a touch electrode) and trace lines connected to the sensing electrode, and may be arranged on the display panel 10. The input sensing layer 40 may sense an external input according to a mutual capacitance method or a self-capacitance method. For example, the input sensing layer 40 may obtain information on the external input through a change in capacitance between two sensing electrodes.

The input sensing layer 40 may be formed directly on the display panel 10. Alternatively, the input sensing layer 40 may be separately formed and then coupled to the display panel 10 via an adhesion layer, such as an OCA. According to an exemplary embodiment of the present disclosure, as shown in FIG. 2A, the input sensing layer 40 may be formed directly on the display panel 10, and in this case, the adhesion layer may not be provided between the input sensing layer 40 and the display panel 10. For example, the input sensing layer 40 and the display panel 10 may be integrated in a single base substrate within the display device 1. Thus, the thickness of the display device 1 may be reduced. Although the input sensing layer 40 is located between the display panel 10 and the optical functional layer 50 as shown in FIG. 2A, the present disclosure is not limited thereto. For example, according to an exemplary embodiment of the present disclosure, the input sensing layer 40 may be located over the optical functional layer 50.

The optical functional layer 50 may include an anti-reflection layer. The anti-reflection layer may reduce reflectivity of light (external light) incident from an external source toward the display panel 10 through the window 60, and may include a phase retarder and a polarizer. The phase retarder may be of a film type or a liquid coating type, and may include a λ/2 phase retarder and/or a λ/4 phase retarder. The polarizer may also be of a film type or a liquid coating type. The polarizer of the film type may include a stretchable synthetic resin film, and the polarizer of the liquid coating type may include liquid crystals arranged in a predetermined arrangement. For example, when both the polarizer and the phase retarder are the film type, a λ/4 phase retarder film (or a λ/2 phase retarder film) may be bonded and laminated onto one surface of the polarizer through an OCA layer. The phase retarder and the polarizer may further include transparent protective films, respectively.

According to an exemplary embodiment of the present disclosure, the anti-reflection layer may include structures such as a black matrix and color filters. The color filters may be arranged by taking into account the colors of light beams emitted by the pixels of the display panel 10. Thus, the desired color may be realized by filtering the light emitted by each of the pixels with the color filter. According to an exemplary embodiment of the present disclosure, the anti-reflection layer may include a destructive interference structure. The destructive interference structure may include a first reflection layer and a second reflection layer arranged on different layers. First reflected light and second reflected light respectively reflected by the first reflection layer and the second reflection layer may be destructively interfered with each other, and thus the reflectance of external light may be reduced.

The optical functional layer 50 may include a lens layer. The lens layer may enhance the emission efficiency or reduce color deviation of light emitted from the display panel 10. The lens layer may include a layer having a concave or convex lens shape, and/or may include a plurality of layers respectively having different refractive indexes. According to an exemplary embodiment of the present disclosure, an array of lenses of the lens layer may cover an array of pixels, in which at least one of the lenses may cover at least one of the pixels. The optical functional layer 50 may include both the anti-reflection layer and the lens layer, or include one of the anti-reflection layer and the lens layer.

The input sensing layer 40 and the optical functional layer 50 may include holes corresponding to the first area A1, respectively. For example, the input sensing layer 40 may include a first hole 40H that completely penetrates the input sensing layer 40, and the optical functional layer 50 may include a second hole 50H that completely penetrates the optical functional layer 50. The first hole 40H and the second hole 50H may be arranged in the first area A1 and may overlap each other. Alternatively, according to an exemplary embodiment of the present disclosure, one or two selected from among the input sensing layer 40 and the optical functional layer 50 may not have a hole corresponding to the first area A1. When the adhesion layer disposed between the window 60 and the optical functional layer 50 includes an OCA, the adhesion layer may not include a hole corresponding to the first area A1, as shown in FIG. 2A. According to an exemplary embodiment of the present disclosure, as shown in FIG. 2B, the optical clear adhesive OCA may include a third hole OCAH corresponding to the first area A1.

A component 20 may be located in the first area A1. The component 20 may include an electronic element. For example, the component 20 may be an electronic element that uses light or sounds. For example, the electronic element may include a sensor that receives and outputs light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light. According to an exemplary embodiment of the present disclosure, the first area A1 may be a transmission area capable of transmitting light that is output from the component 20 to the outside or travels from the outside toward the component 20. For example, the component 20 may include at least one of a camera, a speaker, a lamp, a light detection sensor, or a thermal detection sensor. The component 20 may detect an external object received through the first area A1 or provide a sound signal such as voice to the outside through the first area A1. In addition, the component 20 may include a plurality of configurations, and is not limited to any one exemplary embodiment.

According to an exemplary embodiment of the present disclosure, when the display device 1 is used as a smartwatch or an instrument panel for automobiles, the component 20 may be a member such as a needle of a clock or a needle indicating predetermined information (e.g. a velocity of a vehicle). When the display device 1 includes a needle of a clock or an instrument panel for automobiles, the component 20 may be exposed to the outside through the window 60, and the window 60 may include an opening corresponding to the first area A1.

As described above, the component 20 may include an element or elements capable of adding a function to the display device 1 or may include an element such as an accessory that increases an esthetic sense of the display panel 10. The component 20 may be disposed in the first area A1 to overlap the first and second hoes 40H and 50H. Accordingly, since the component 20 is assembled to overlap the first and second hoes 40H and 50H in a plan view, it may easily communicate with the outside through the first and second hoes 40H and 50H.

Figure 3A:
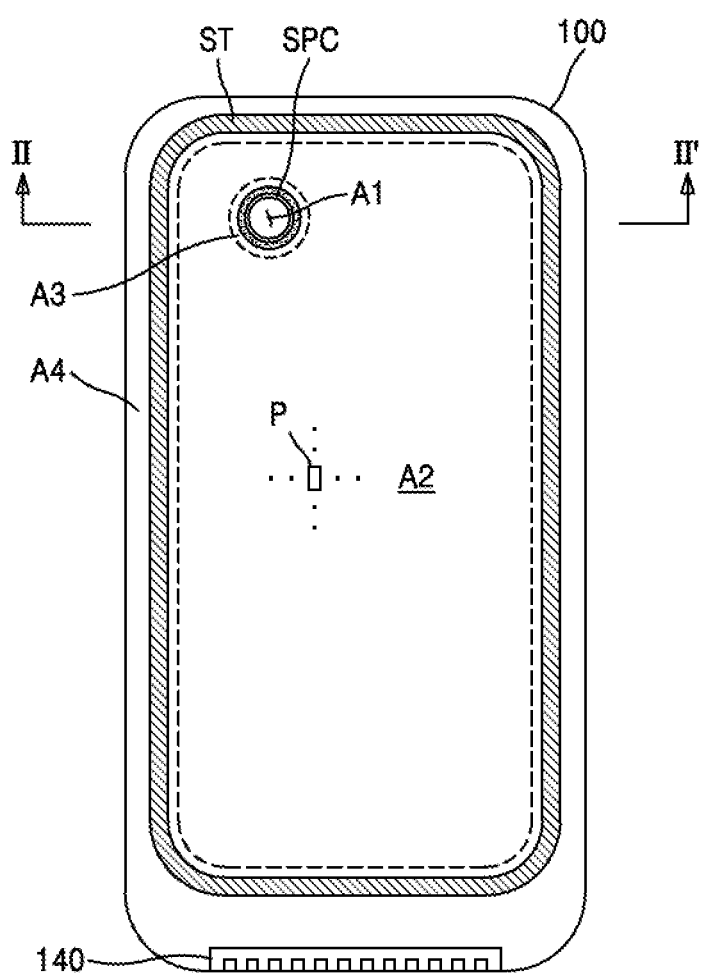
FIG. 3A is a schematic plan view of a display panel according to an exemplary embodiment of the present disclosure.
Figure 3B:
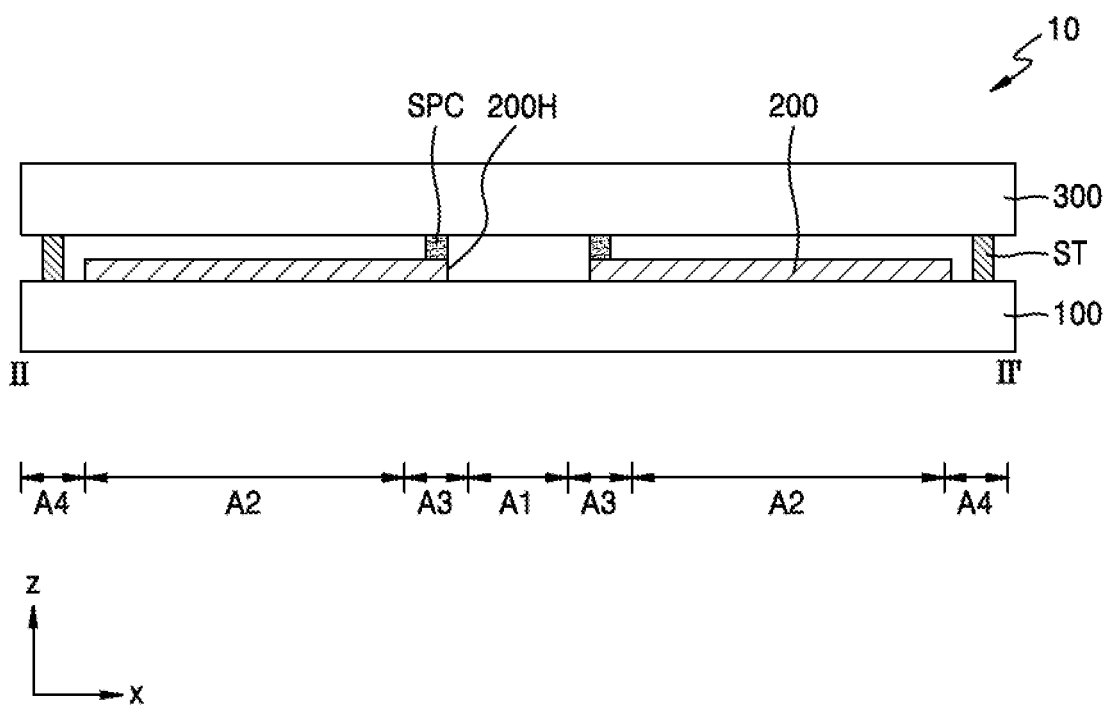
FIG. 3B is a cross-sectional view taken along line II-II' of FIG. 3A.

FIG. 3A is a schematic plan view of the display panel 10 according to an exemplary embodiment of the present disclosure, and FIG. 3B is a cross-sectional view taken along line II-II' of FIG. 3A.

Referring to FIGS. 3A and 3B, the display panel 10 includes a display layer 200 disposed on a substrate 100. The substrate 100 may include a glass material and/or a polymer resin, and may have a single layer structure or a multi-layer structure. For example, the substrate 100 may include a glass material mainly containing silicon oxide ($SiO_2$), and/or a resin such as reinforced plastic. According to an exemplary of the present disclosure, the substrate 100 may have a multi-layer structure, and may include one or more base layers and one or more barrier layers. The polymer resin may be transparent, and may be provided such that at least a part of the display panel 10 may be easily bent. Alternatively, the substrate 100 may be provided in a rigid state.

The display layer 200 may be located to correspond to the second area A2, and may include a plurality of pixels. Each of the plurality of pixels included in the display layer 200 may include a pixel circuit and a display element electrically connected to the pixel circuit. The pixel circuit may include a transistor and a storage capacitor, and the display element may include a light-emitting diode, for example, an organic light-emitting diode (OLED).

The display layer 200 may be covered by an encapsulation member 300. The encapsulation member 300 may be an encapsulation substrate including a glass material and/or polymer resin. For example, the encapsulation member 300 may include a glass material mainly containing silicon oxide (SiO$_2$), and/or a resin such as reinforced plastic. When the substrate 100 includes a polymer resin and encapsulation member 300 includes a polymer resin, the flexibility of the display panel 10 may be enhanced. The encapsulation member 300 may be arranged to face the substrate 100, and a sealant ST may be disposed between the substrate 100 and the encapsulation member 300. The encapsulation member 300 may be spaced apart from the display layer 200 and/or the substrate 100 by a predetermined gap, and the gap may be maintained by the sealant ST. The sealant ST may be located in the fourth area A4, and may be continuously arranged along the substrate 100 between the substrate 100 and the encapsulation member 300 and may entirely surround the display layer 200. When viewed from a direction perpendicular to the upper surface of the substrate 100 (or in a plan view), the second area A2 may be entirely surrounded by the sealant ST. The sealant ST couples the substrate 100 with the encapsulation member 300 and thus may function to prevent, for example, oxygen, moisture, or the like from entering the display layer 200 and to increase an instrumental strength.

The sealant ST may be an inorganic material, for example, frit. The sealant ST may be formed by coating according to a dispenser method or a screen printing method. The frit may include a crystalized (fully and/or partially crystallized) base or mother glass. Frit generally means a powder-type material for making glass, but may also mean a paste-type material in which a laser or infrared absorbing material, an organic binder, and a filler for reducing a thermal expansion coefficient are added to a main material such as silicon oxide (SiO$_2$). The paste-type frit may be cured due to removal of the organic binder and moisture via a drying or firing process. The laser or infrared absorbing material may include a transition metal compound. Laser light may be used as a heat source for curing the sealant ST to attach the substrate 100 to the encapsulation member 300.

A portion of the display layer 200, for example, a portion corresponding to the first area A1, may be removed. With regard to this, FIG. 3B illustrates that the display layer 200 includes a fourth hole 200H. The display layer 200 may further include, in addition to the aforementioned pixel circuits and the aforementioned display elements, insulating layers arranged between wires connected to each pixel circuit, between electrodes, and/or between the electrodes of the display elements. For example, the fourth hole 200H may be formed by respective holes of the insulating layers included in the display layer 200 that overlap each other (see FIGS. 8, 11-13, 18 and 20). The fourth hole 200H of the display layer 200 may be formed to completely penetrate the display layer 200 from its top surface to its bottom surface. However, as shown in FIG. 3B, the substrate 100 may not have a through-hole corresponding to the first area A1, and the encapsulation member 300 may not have a through-hole corresponding to the first area A1. The display layer 200 arranged in the third area A3 may include no pixel circuits and no display elements.

A spacer SPC may be arranged in the third area A3. The spacer SPC may be arranged above at least one insulating layer extending from the second area A2 to the third area A3, and may include an organic material. The spacer SPC may be arranged around the first area A1. According to an exemplary embodiment of the present disclosure, the spacer SPC may include first spacers (see FIG. 7) being a plurality of island-shaped insulating patterns spaced apart from each other. According to an exemplary embodiment of the present disclosure, the spacer SPC may include first spacers being a plurality of island-shaped insulating patterns spaced apart from each other, and a second spacer (see FIG. 19) being a ring-shaped insulating pattern which surrounds the first area A1. The spacer SPC may function to maintain a gap between the substrate 100 and the encapsulation member 300 and support the encapsulation member 300, and may function to separate the first area A1 from the second area A2 to prevent a material such as, for example, oxygen, moisture, or the like introduced via the first area A1 from permeating the display layer 200. FIGS. 3A and 3B schematically illustrate the spacer SPC for convenience of illustration, and illustrate that the spacer SPC is located on the display layer 200. However, the spacer SPC may be a part of the display layer 200.

A pad unit 140 including a plurality of pads may be arranged on one side of the fourth area A4. The pad unit 140 may be exposed by not being covered by an insulating layer, and may be electrically connected to a printed circuit board PCB. According to an exemplary embodiment of the present disclosure, a flexible printed circuit board (FPCB) may be electrically connected to the pad unit 140 located at a side of the display panel 10 in the fourth area A4. The FPCB may be bent and electrically connected to the display panel 10. Accordingly, the FPCB may output a signal to the display panel 10 or receive a signal from the display panel 10 through the pad unit 140. The pad unit 140 may be arranged outside the sealant ST. The sealant ST may be arranged above a plurality of connection lines connecting wires connected to the pixels of the second area A2 to the pad unit 140, and may overlap some of the plurality of connection lines.

Figure 4:
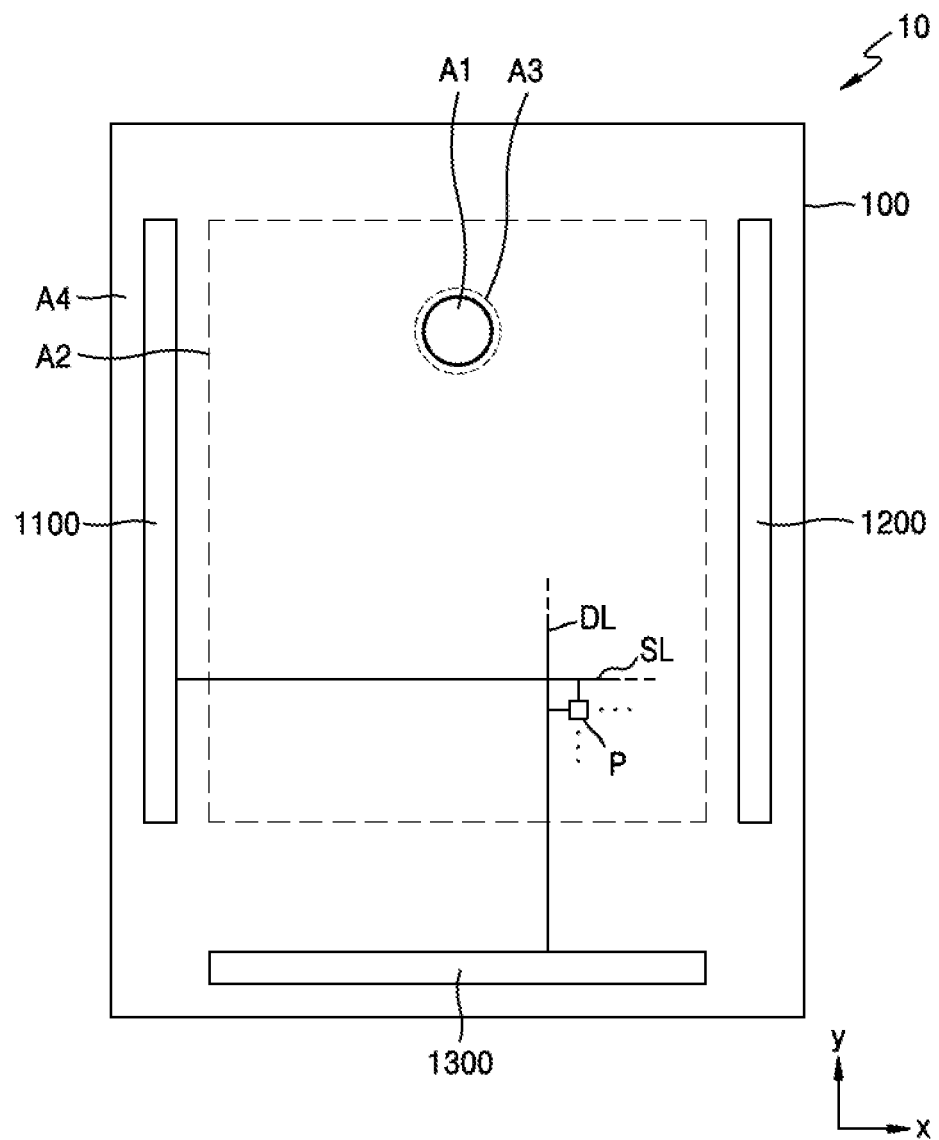
FIG. 4 is a schematic plan view of a display panel according to an exemplary embodiment of the present disclosure.
Figure 5:
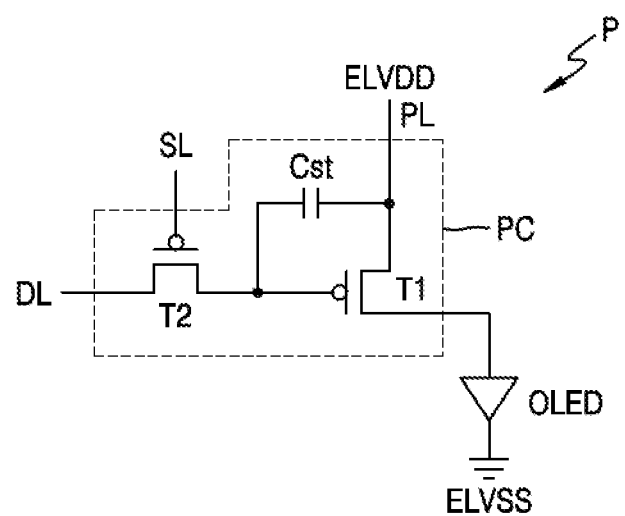
FIG. 5 is a schematic equivalent circuit diagram of one pixel of the display panel.

FIG. 4 is a schematic plan view of the display panel 10 according to an exemplary embodiment of the present disclosure, and FIG. 5 is a schematic equivalent circuit diagram of one pixel P of the display panel 10.

The figure of the display panel 10 may be actually the same as that of the display panel 10 described above with reference to FIGS. 3A and 3B. For example, the display panel 10 may include, as shown in FIG. 4, the first area A1, the second area A2 surrounding the first area A1, the third area A3 located between the first area A1 and the second area A2, and the fourth area A4 surrounding the second area A2.

The display panel 10 may include a plurality of pixels P arranged in the second area A2. As shown in FIG. 5, each of the pixels P may include a pixel circuit PC and an organic light-emitting diode OLED as a display element connected to the pixel circuit PC. The pixel circuit PC may include a first transistor T1, a second transistor T2, and a capacitor Cst. Each of the pixels P may emit, for example, red light, green light, or blue light, or may emit red light, green light, blue light, or white light, via the organic light-emitting diode OLED. The first transistor T1 and the second transistor T2 may be implemented using thin-film transistors. The display panel 10 may display a predetermined image through light emitted from the plurality of pixels P arranged in the second area A2 according to an electrical signal.

The second transistor T2, which is a switching transistor for controlling turn-on and turn-off of the pixel P, may be connected to a scan line SL and a data line DL, and may transmit, to the first transistor T1, a data signal received via the data line DL, based on a switching voltage received via the scan line SL. The capacitor Cst may be connected to the second transistor T2 and a driving voltage line PL, and may store a voltage corresponding to a difference between a voltage received from the second transistor T2 and a first power supply voltage ELVDD supplied to the driving voltage line PL.

The first transistor T1, which is a driving transistor, may be connected to the driving voltage line PL and the capacitor Cst, and may control a driving current flowing from the driving voltage line PL to the organic light-emitting diode OLED, in accordance with a voltage value stored in the capacitor Cst. The organic light-emitting diode OLED may emit light having a certain brightness according to the driving current. The turn-on time of the first transistor T1 may be determined according to the amount of voltage stored in the capacitor Cst. The first transistor T1 may then provide to the organic light-emitting diode OLED the first power supply voltage ELVDD transmitted through the driving voltage line PL during the turn-on time. An opposite electrode (for example, a cathode) of the organic light-emitting diode OLED may receive a second power supply voltage ELVSS.

Although a case where the pixel circuit PC includes two transistors and one storage capacitor is illustrated in FIG. 5, the present disclosure is not limited thereto. The number of transistors and the number of storage capacitors may vary according to a design of the pixel circuit PC. For example, the pixel circuit PC may include three, four, five, or more transistors instead of the above two transistors. Also, more than one storage capacitors may be included in the pixel circuit PC.

Referring back to FIG. 4, the third area A3 may surround the first area A1. The third area A3 is an area in which a display element such as an organic light-emitting diode OLED is not arranged. Signal lines configured to provide signals to pixels P arranged around the first area A1 may traverse the third area A3. In the fourth area A4, a first scan driver 1100 and a second scan driver 1200 each providing a scan signal to each of the pixels P, a data driver 1300 providing a data signal to each of the pixels P, and main power wires for providing the first power supply voltage ELVDD and the second power supply voltage ELVSS may be arranged. The first scan driver 1100 and the second scan driver 1200 may each be located in the fourth area A4, and may be respectively arranged on both sides of the second area A2 with the second area A2 disposed therebetween. The first scan driver 1100, the second scan driver 1200, and the data driver 1300 may be arranged outside the sealant ST arranged in the fourth area A4.

In FIG. 4, the data driver 1300 is located on one edge of the substrate 100. However, according to an exemplary embodiment of the present disclosure, the data driver 1300 may be located on a flexible printed circuit board (FPCB) electrically connected to a pad (e.g., the pad unit 140) arranged on one side of the display panel 10. Accordingly, the FPCB may output a signal to the display panel 10 or receive a signal from the display panel 10.

Figure 6A:
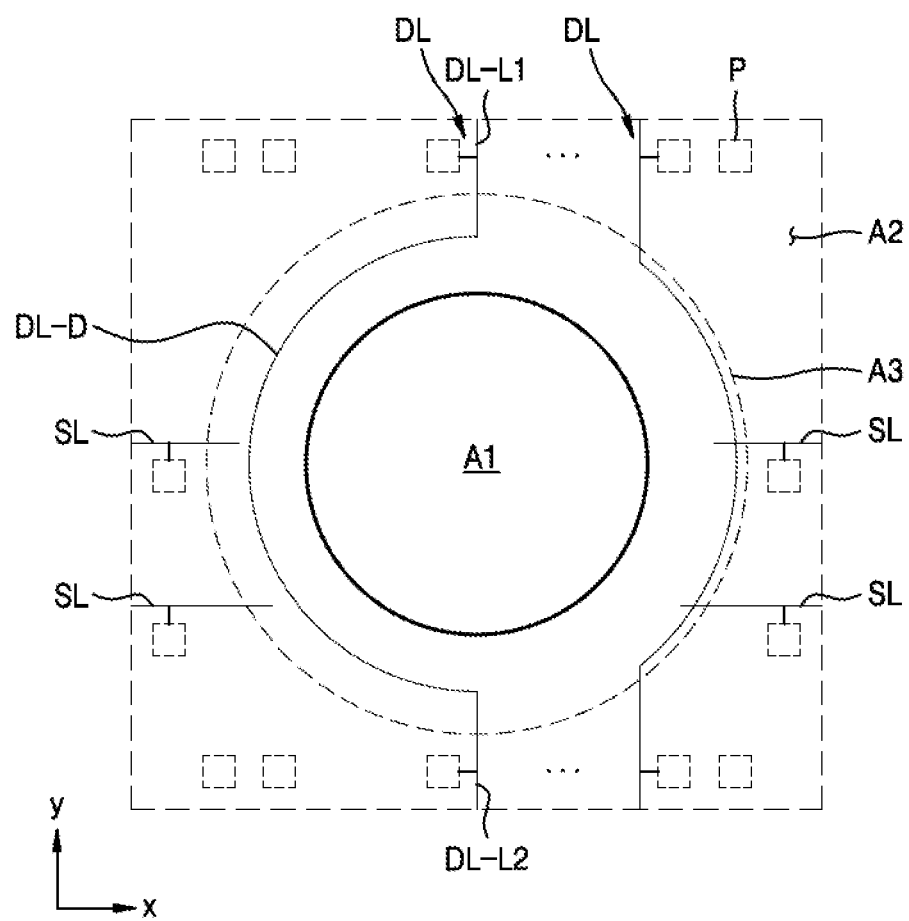
FIGS. 6A and 6B are schematic plan views of a display device according to an exemplary embodiment of the present disclosure.
Figure 6B:
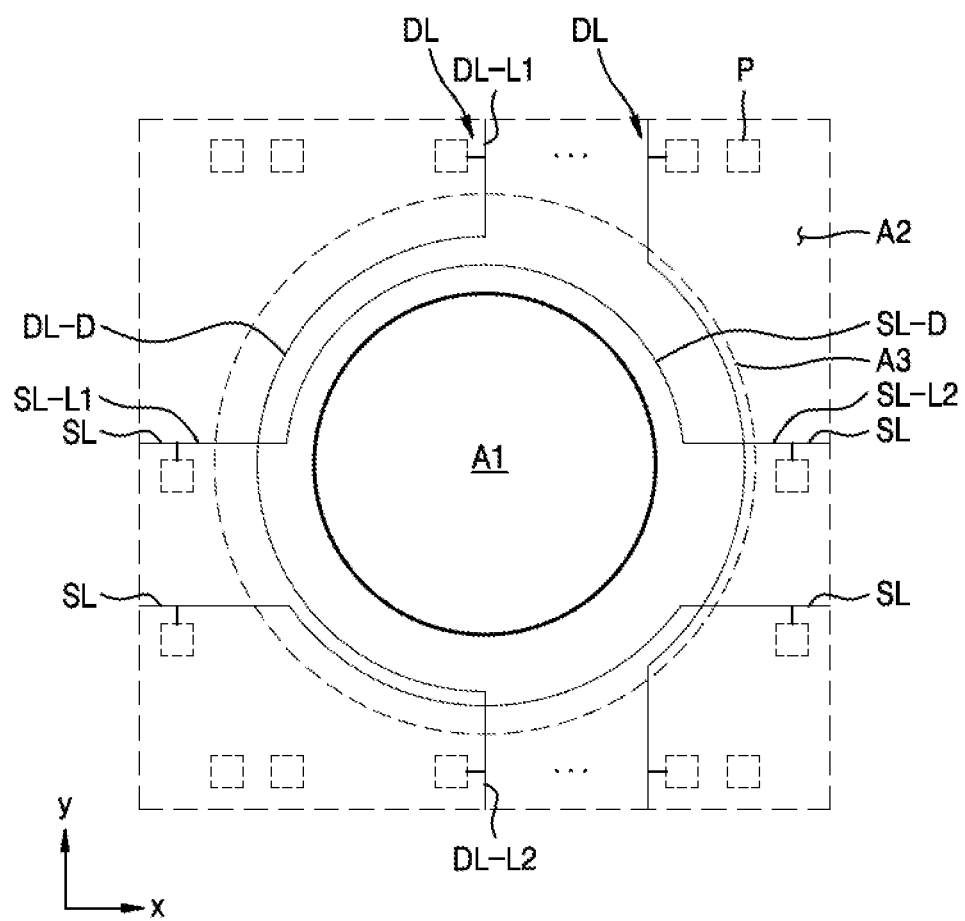

FIGS. 6A and 6B are schematic plan views of a display device according to an exemplary embodiment of the present disclosure.

Referring to FIG. 6A, some of the pixels P formed in the second area A2 may be spaced apart from each other around the first area A1. For example, the first area A1 may be located between two pixels P arranged in x direction of FIG. 6A. Similarly, the first area A1 may be located between two pixels P arranged in y direction of FIG. 6A. Since the third area A3 is an area where the pixels P are not located, in the plan view, some of the pixels P may be located above and below (y direction) the third area A3 and some of the pixels P may be located at the left and the right (x direction) of the third area A3.

The two pixels P arranged in the y direction with the first area A1 located therebetween may be electrically connected to the same data line DL, and the data line DL may be curved in the third area A3. For example, a portion of the data line DL may be curved and extend along an edge of the first area A1 in the third area A3, for example, along the circular arc of the first area A1. The data line DL may include first and second portions DL-L1 and DL-L2 extending in the y direction and traversing the second area A2 to apply a data signal to the pixels P, and a third portion DL-D connected to the first and second portions DL-L1 and DL-L2 and extending along the circular arc of the first area A1 within the third area A3. According to an exemplary embodiment of the present disclosure, the first portion DL-L1, the second portion DL-L2, and the third portion DL-D may be integrally formed into a wire on the same layer. According to an exemplary embodiment of the present disclosure, the first portion DL-L1 and the second portion DL-L2 may be not connected to each other on the same layer, and the third portion DL-D may be arranged on a layer different from the layer on which the first portion DL-L1 and the second portion DL-L2 are arranged and may be electrically connected to the first portion DL-L1 and the second portion DL-L2 via contact holes.

The two pixels P arranged in the x direction with the first area A1 located therebetween may be electrically connected to different scan lines SL, respectively. Scan lines SL on the left side of the first area A1 may be electrically connected to the first scan driver 1100 described above with reference to FIG. 4, and scan lines SL on the right side of the first area A1 may be electrically connected to the second scan driver 1200 described above with reference to FIG. 4. When the display panel 10 includes two scan drivers as shown in FIG. 4, the pixels P on both sides of the first area A1 may be electrically connected to scan lines SL spaced apart from each other.

According to an exemplary embodiment of the present disclosure, as shown in FIG. 6B, when the second scan driver 1200 is omitted, the two pixels P arranged in the x direction with the first area A1 located therebetween may be connected to the same scan line, and the scan line may include, like the data line DL, a portion extending along the circular arc of the first area A1 within the third area A3. For example, the scan line SL may include first and second portions SL-L1 and SL-L2 extending in the x direction to apply a scan signal to the pixels P and traversing the second area A2, and a third portion SL-D connected to the first and second portions SL-L1 and SL-L2 and extending along the circular arc of the first area A1 within the third area A3. According to an exemplary embodiment of the present disclosure, the first portion SL-L1, the second portion SL-L2, and the third portion SL-D may be integrally formed into a wire on the same layer. According to an exemplary embodiment of the present disclosure, the first portion SL-L1 and the second portion SL-L2 may be not connected to each other on the same layer, and the third portion SL-D may be arranged on a layer different from the layer on which the first portion SL-L1 and the second portion SL-L2 are arranged and may be electrically connected to the first portion SL-L1 and the second portion SL-L2 via contact holes.

Figure 8:
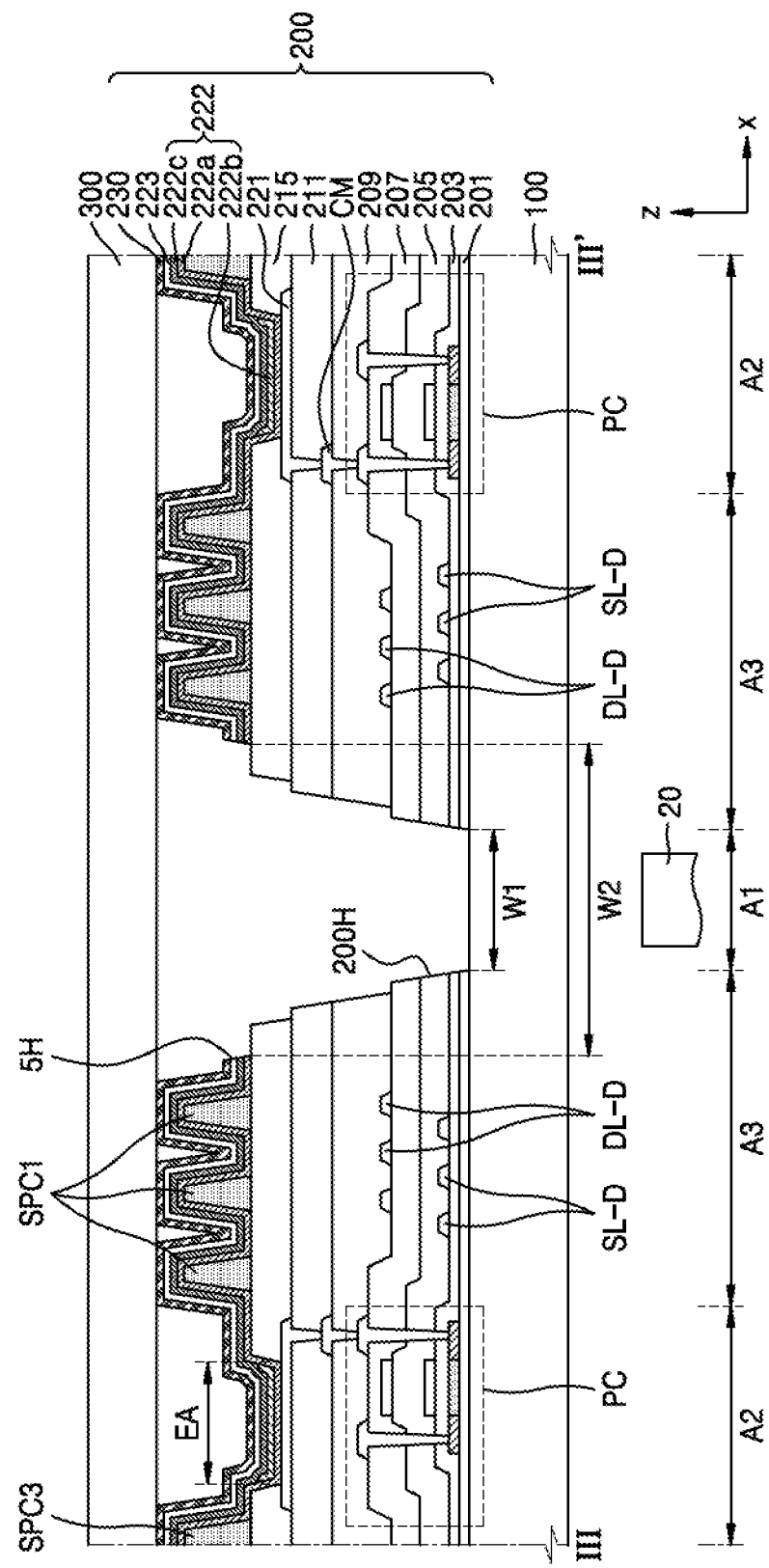
FIG. 8 is a cross-sectional view of the portion of the display panel taken along line III-III' of FIG. 7.
Figure 9A:
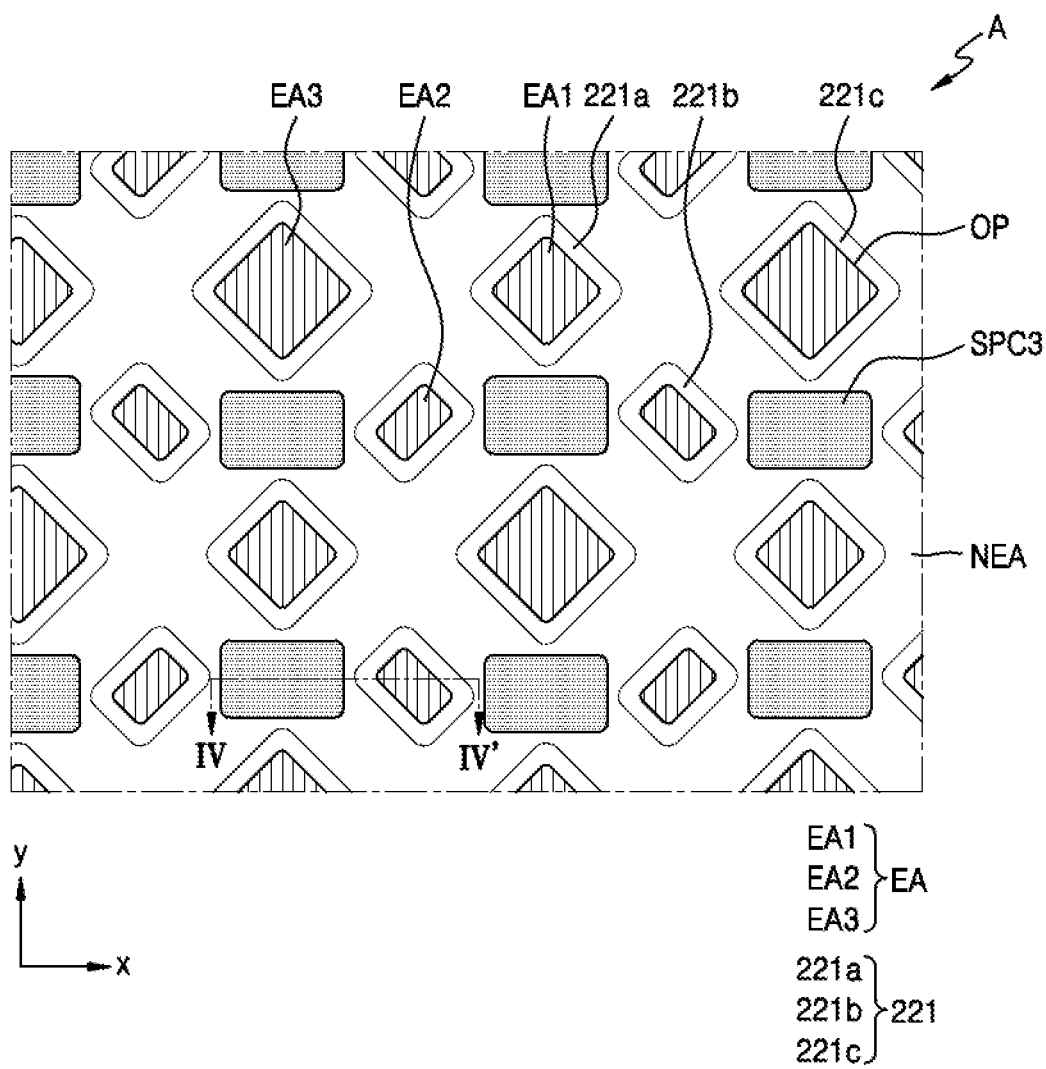
FIGS. 9A and 9B are partially magnified views of the second area A2 (area A) and the third area A3 (area B) of FIG. 7, respectively.
Figure 9B:
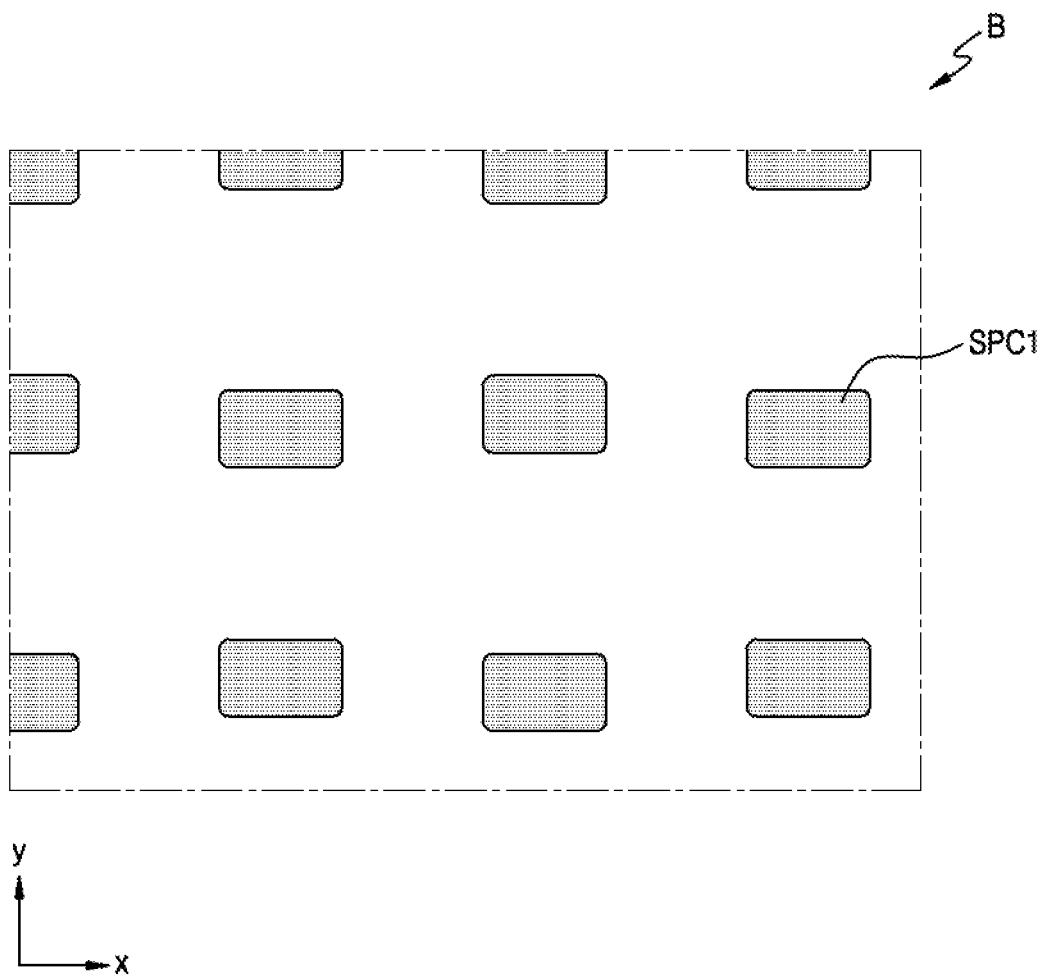
Figure 10:
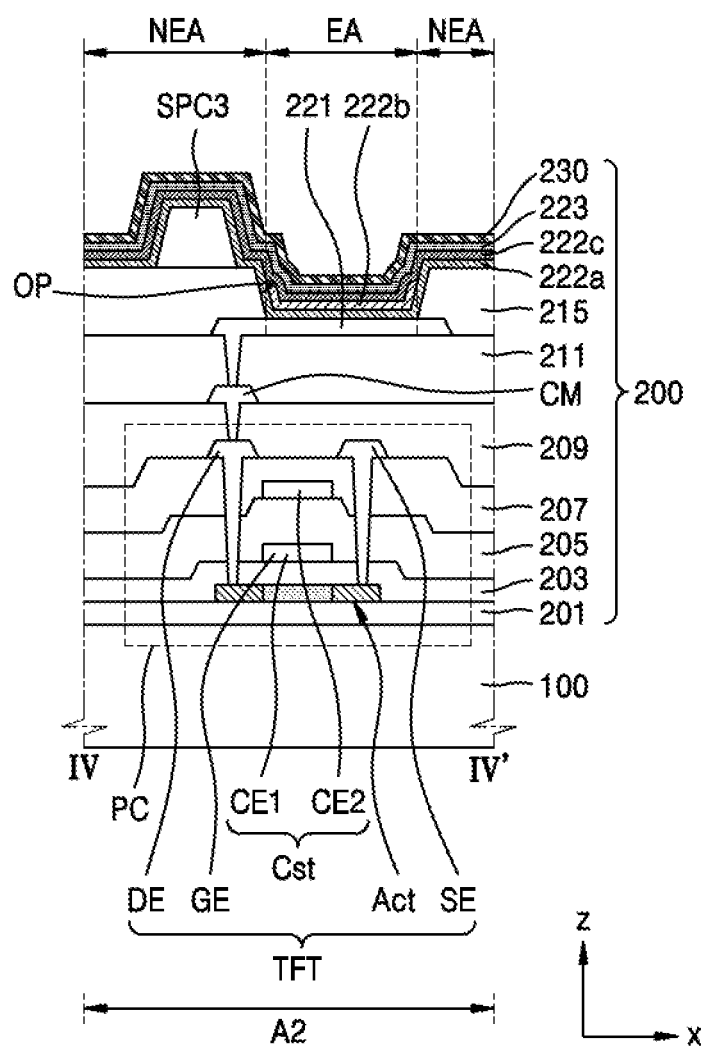
FIG. 10 is a cross-sectional view of the second area taken along line IV-IV' of FIG. 9A.
Figure 11:
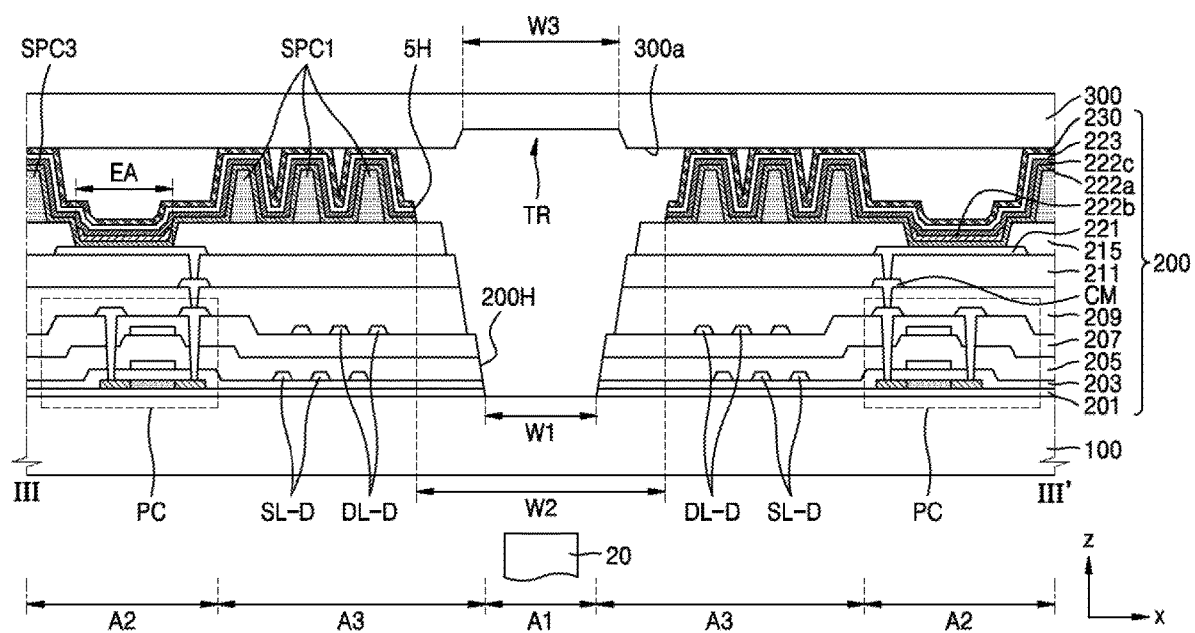
FIGS. 11 through 13 illustrate other cross-sections taken along line III-III' of FIG. 7, respectively.
Figure 12:
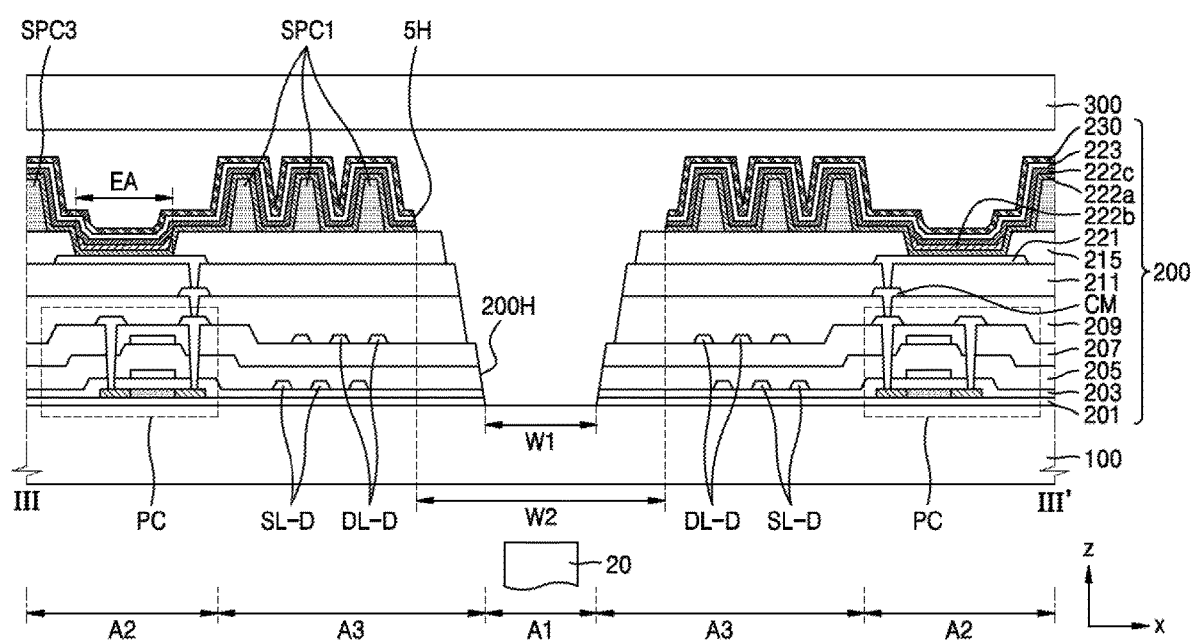
Figure 13:
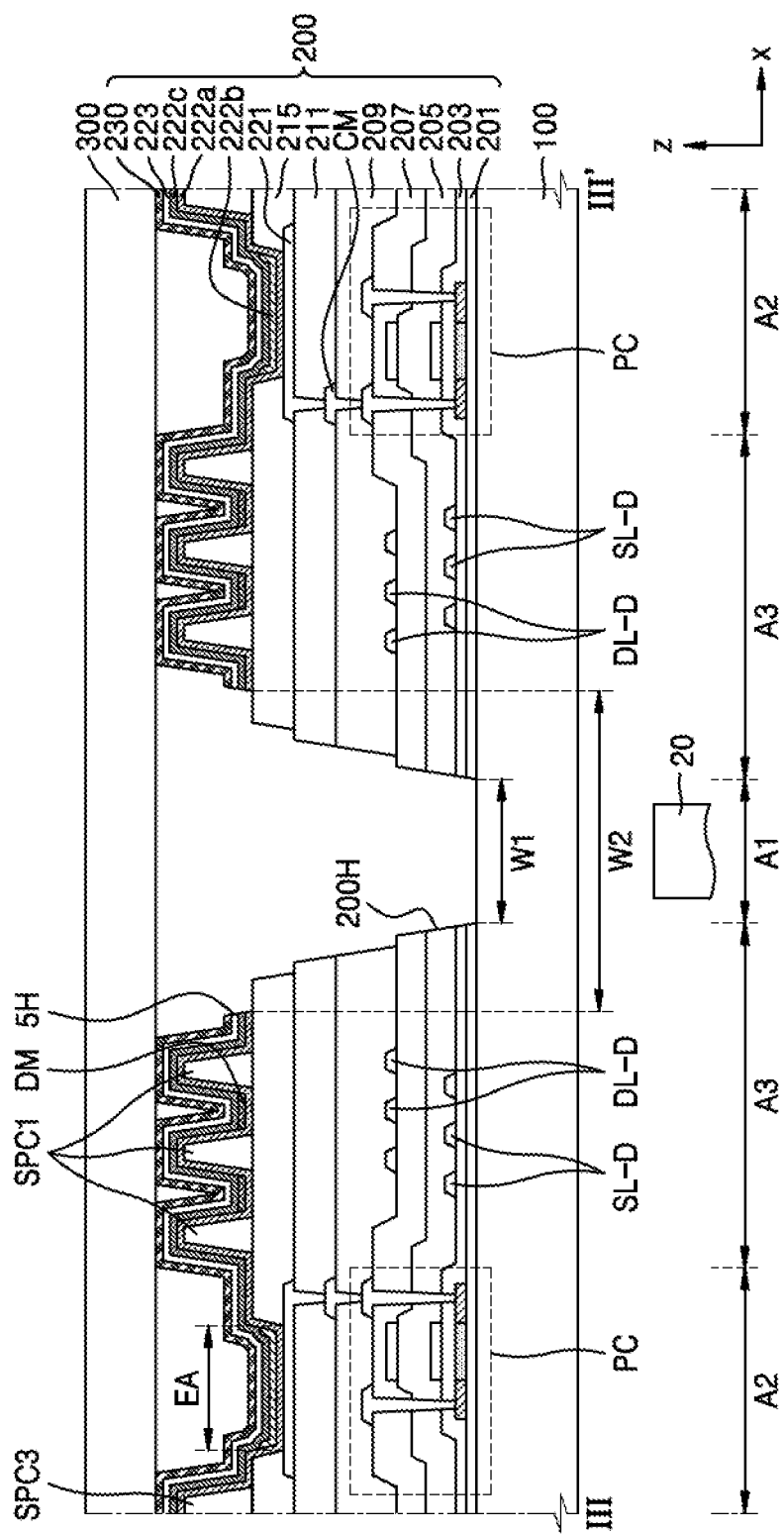

FIG. 7 schematically illustrates a portion of the display panel 10 according to an exemplary embodiment of the present disclosure. FIG. 8 illustrates a cross-section of the portion of the display panel taken along line III-III' of FIG. 7. FIGS. 9A and 9B are partially magnified views of the second area A2 (magnified view of area A) and the third area A3 (magnified view of area B) of FIG. 7, respectively, and FIG. 10 is a cross-sectional view of the second area A2 taken along line IV-IV' of FIG. 9A. FIGS. 11 through 13 illustrate other cross-sections taken along line III-III' of FIG. 7, respectively.

FIG. 7 illustrates a portion of the display panel 10 including the first area A1 and the third area A3 surrounding the first area A1. A plan view PV of FIG. 7 refers to a view defined on an xy plane, and a cross-sectional view CSV of FIG. 7 refers to a view defined on an xz plane. The cross-sectional view CSV of FIG. 7 may correspond to a cross-section taken along line III-III' of the plan view PV of FIG. 7.

Referring to FIG. 7, a plurality of first spacers SPC1 may be arranged in the third area A3 of the display panel 10. The first spacers SPC1 may be arranged on a stack of at least one inorganic insulating layer IL and at least one organic insulating layer OL above the substrate 100. The first spacers SPC1 may be island-shaped insulating patterns. The first spacers SPC1 may be arranged at regular intervals in the third area A3. In other words, a plurality of first spacers SPC1 each having an island shape and spaced apart from each other may be formed on an insulating layer in the third area A3, with the insulating layer including at least one inorganic insulating layer IL and at least one organic insulating layer OL, in which the at least one organic insulating layer OL may be formed on the at least one inorganic insulating layer IL, and stacked between the plurality of first spacers SPC1 and the at least one inorganic insulating layer IL. Some of the first spacers SPC1 may be arranged at the boundary between the second area A2 and the third area A3, and thus may be arranged in both the second area A2 and the third area A3. In other words, each of the first spacers includes at least a portion arranged in the third area A3.

In the second area A2 of the display panel 10, a plurality of third spacers SPC3 may be arranged. The third spacers SPC3 may be arranged on the stack of the at least one inorganic insulating layer IL and the at least one organic insulating layer OL above the substrate 100. The third spacers SPC3 may be island-shaped insulating patterns. The third spacers SPC3 may be arranged at regular intervals in the second area A2. In other words, a plurality of third spacers SPC3 may be located on an insulating layer in the second area A2, each having an island shape, and arranged between a plurality of display elements (see FIG. 9A), in which the at least one organic insulating layer OL may be formed on the at least one inorganic insulating layer IL, and stacked between the plurality of third spacers SPC3 and the at least one inorganic insulating layer IL. The first spacers SPC1 and the third spacers SPC3 may be insulating patterns having the same shape. According to an exemplary embodiment of the present disclosure, the first spacers SPC1 and the third spacers SPC3 may include the same material. According to an exemplary embodiment of the present disclosure, the first spacers SPC1 and the third spacers SPC3 may include materials different from each other. A width Wa of each of the first spacers SPC1 in the x direction may be equal to or different from a width Wc of each of the third spacers SPC3 in the x direction.

The at least one inorganic insulating layer IL and the at least one organic insulating layer OL may be insulating layers each extending from the second area A2 to the third area A3. For example, the at least one inorganic insulating layer IL may include at least one of a buffer layer 201, a gate insulating layer 203, a first interlayer insulating layer 205, or a second interlayer insulating layer 207 of FIGS. 8 and 10. The at least one organic insulating layer OL may include at least one of a first organic insulating layer 209, a second organic insulating layer 211, or a pixel defining layer 215 of FIGS. 8 and 10. For example, as shown in FIGS. 7 (CSV), 8 and 10, the at least one organic insulating layer OL is formed on the at least one inorganic insulating layer IL.

Referring to FIGS. 8 and 10, the pixel circuit PC may be arranged on the substrate 100, and the organic light-emitting diode OLED electrically connected to the pixel circuit PC may be arranged on the pixel circuit PC. As described above with reference to FIGS. 3A and 3B, the substrate 100 may include, for example, a glass material or a polymer resin. The substrate 100 may be a single layer or multiple layers. When the substrate 100 has multiple layers, the substrate 100 may include one or more base layers and one or more barrier layers.

The buffer layer 201 is to prevent infiltration of impurities into a semiconductor layer Act of a thin-film transistor TFT, and may be arranged on the substrate 100. The buffer layer 201 may include an inorganic insulating (insulative) material such as, for example, silicon nitride ($Si_3N_4$), silicon oxynitride (SiON), or silicon oxide ($SiO_2$), and may be a single layer or multiple layers including the inorganic insulating material.

The pixel circuit PC may be arranged on the buffer layer 201. The pixel circuit PC may include the thin-film transistor TFT and the capacitor Cst. The thin-film transistor TFT may include the semiconductor layer Act, a gate electrode GE, a source electrode SE, and a drain electrode DE. The gate electrode GE may overlap the semiconductor layer Act. The portion of the semiconductor layer Act overlapping the gate electrode GE may be the channel region of the thin-film transistor TFT. The source and drain regions of the thin-film transistor TFT may include the portions of the semiconductor layer Act located at both sides of the channel region. The thin-film transistor TFT of FIG. 10 may correspond to one of the transistors described above with reference to FIG. 5, for example, the driving transistor (first transistor T1 of FIG. 5). According to the present exemplary embodiment, the thin-film transistor TFT is a top gate type in which the gate electrode GE is arranged on the semiconductor layer Act with the gate insulating layer 203 interposed therebetween. However, the present disclosure is not limited thereto. For example, according to an exemplary embodiment of the present disclosure, the thin-film transistor TFT may be a bottom gate type.

The semiconductor layer Act may include polysilicon (poly-Si). Alternatively, the semiconductor layer Act may include, for example, amorphous silicon (a-Si), an oxide semiconductor, or an organic semiconductor. The gate electrode GE may include a low resistance metal material. The gate electrode GE may include a conductive material including, for example, silver (Ag), molybdenum (Mo), aluminum (Al), copper (Cu), chromium (Cr), nickel (Ni), titanium (Ti), an alloy thereof, etc., and may be formed as a multi-layer or single layer including the aforementioned materials.

The gate insulating layer 203 disposed between the semiconductor layer Act and the gate electrode GE may include an inorganic insulating material such as, for example, silicon oxide ($SiO_2$), silicon nitride ($Si_3N_4$), silicon oxynitride (SiON), aluminum oxide ($Al_2O_3$), titanium oxide ($TiO_2$), tantalum oxide ($Ta_2O_5$), lanthanum oxide ($La_2O_3$), zirconium oxide ($ZrO_2$), or hafnium oxide ($HfO_2$), etc. The gate insulating layer 203 may be a single layer or multi-layer including the aforementioned materials.

The source electrode SE and the drain electrode DE that are connection electrodes electrically connected to the semiconductor layer Act may be located on a layer the same as that of the data line DL, and may include a material the same as that of the data line DL. The portion of the semiconductor layer Act connected to the source electrode SE or the drain electrode DE may be doped with an n-type dopant or a p-type dopant. The source electrode SE and the drain electrode DE may include a highly conductive material. Each of the source electrode SE and the drain electrode DE may include a conductive material including, for example, silver (Ag), molybdenum (Mo), aluminum (Al), copper (Cu), chromium (Cr), nickel (Ni), titanium (Ti), an alloy thereof, etc., and may be a multi-layer or single layer including the aforementioned materials. According to an exemplary embodiment of the present disclosure, each of the source electrode SE and the drain electrode DE may be formed as a multi-layer of titanium/aluminum/titanium (Ti/Al/Ti).

The capacitor Cst may include a lower electrode CE1 and an upper electrode CE2 overlapping each other with the first interlayer insulating layer 205 disposed therebetween. The capacitor Cst and the thin-film transistor TFT may overlap each other. With regard to this, FIG. 10 illustrates a case where the gate electrode GE of the thin-film transistor TFT is the lower electrode CE1 of the capacitor Cst. According to an exemplary embodiment of the present disclosure, the capacitor Cst and the thin-film transistor TFT may not overlap each other. The capacitor Cst may be covered by the second interlayer insulating layer 207. The upper electrode CE2 of the storage capacitor Cst may include a conductive material including, for example, silver (Ag), molybdenum (Mo), aluminum (Al), copper (Cu), chromium (Cr), nickel (Ni), titanium (Ti), an alloy thereof, etc., and may be a multi-layer or single layer including the aforementioned materials.

The first interlayer insulating layer 205 and the second interlayer insulating layer 207 may each include an inorganic insulating material such as, for example, silicon oxide ($SiO_2$), silicon nitride ($Si_3N_4$), silicon oxynitride (SiON), aluminum oxide ($Al_2O_3$), titanium oxide ($TiO_2$), tantalum oxide ($Ta_2O_5$), or hafnium oxide ($HfO_2$), etc. Each of the first interlayer insulating layer 205 and the second interlayer insulating layer 207 may be a single layer or multi-layer including the aforementioned materials.

The pixel circuit PC including the thin-film transistor TFT and the capacitor Cst may be covered with the first organic insulating layer 209. The first organic insulating layer 209 is a planarization insulating layer, and an upper surface thereof may include an approximately flat surface. The first organic insulating layer 209 may include an organic insulating (insulative) material, such as, for example, a commercial polymer (such as polymethyl methacrylate (PMMA) or polystyrene (PS)), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, or a blend thereof. According to an exemplary embodiment of the present disclosure, the first organic insulating layer 209 may include polyimide (PI).

A connecting metal electrode CM may be on the first organic insulating layer 209. The connecting metal electrode CM may contact the thin-film transistor TFT (e.g., contact the drain electrode DE of the thin-film transistor TFT) through a contact hole formed in the first organic insulating layer 209, and a pixel electrode 221 may contact the connecting metal electrode CM through a contact hole formed in a second organic insulating layer 211. The connecting metal electrode CM may include a conductive material including, for example, molybdenum (Mo), aluminum (Al), copper (Cu), titanium (Ti), an alloy thereof, etc., and may be formed as a multi-layer or single layer including the aforementioned materials. The connecting metal electrode CM may include a material the same as that included in the source electrode SE or the drain electrode DE of the thin-film transistor TFT. For example, the connecting metal electrode CM may be formed as a multi-layer of titanium/aluminum/titanium (Ti/Al/Ti).

The second organic insulating layer 211 may be disposed on the connecting metal electrode CM. An upper surface of the second organic insulating layer 211 may include an approximately flat surface. The second organic insulating layer 211 may include an organic insulating material, such as, for example, a commercial polymer (such as polymethyl methacrylate (PMMA) or polystyrene (PS)), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, or a blend thereof. According to an exemplary embodiment of the present disclosure, the second organic insulating layer 211 may include polyimide (PI). According to an exemplary embodiment of the present disclosure, each of the first organic insulating layer 209 and the second organic insulating layer 211 may be formed by spin coating. An inorganic insulating layer may be further arranged between the first organic insulating layer 209 and the second organic insulating layer 211.

The pixel electrode 221 may be disposed on the second organic insulating layer 211. The pixel electrode 221 may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO). According to an exemplary embodiment of the present disclosure, the pixel electrode 221 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to an exemplary embodiment of the present disclosure, the pixel electrode 221 may further include a film formed of, for example, indium tin oxide (ITO), indium zinc oxide (IZO), zinc oxide (ZnO), or indium oxide ($In_2O_3$) above/below the aforementioned reflection layer. The pixel electrode 221 may be electrically connected to the thin-film transistor TFT of the pixel circuit PC via the connecting metal electrode CM.

The pixel defining layer 215 may be disposed on the pixel electrode 221. The pixel defining layer 215 may include an opening OP via which an upper surface of the pixel electrode 221 is exposed, and may cover an edge of the pixel electrode 221. The opening OP of the pixel defining layer 215 may define a light-emission area EA. The pixel defining layer 215 may be disposed between a plurality of pixel electrodes 221, and may include an organic insulating material. Alternatively, the pixel defining layer 215 may include an inorganic insulating material such as, for example, silicon nitride ($Si_3N_4$), silicon oxynitride (SiON), or silicon oxide ($SiO_2$). Alternatively, the pixel defining layer 215 may include an organic insulating material and an inorganic insulating material.

An intermediate layer 222 located between the pixel electrode 221 and an opposite electrode 223 may include an emission layer 222b. The emission layer 222b may include, for example, an organic material. The emission layer 222b may include a low molecular weight or high molecular weight organic material that emits light of a certain color. The intermediate layer 222 may include a first functional layer 222a disposed below the emission layer 222b, and/or a second functional layer 222c disposed above the emission layer 222b. According to an exemplary embodiment of the present disclosure, the emission layer 222b may include at least one of materials emitting red, green, or blue light, and may include a fluorescent material or a phosphorescent material.

The first functional layer 222a may be a single layer or multiple layers. For example, when the first functional layer 222a includes a high molecular weight organic material, the first functional layer 222a is a hole transport layer (HTL) having a single-layered structure, and may include, for example, poly(3,4-ethylenedioxythiophene) (PEDOT) or polyaniline (PANI). When the first functional layer 222a includes a low molecular weight material, the first functional layer 222a may include a hole injection layer (HIL) and a hole transport layer (HTL).

The second functional layer 222c may be optional. For example, when the first functional layer 222a and the emission layer 222b include high molecular weight materials, the second functional layer 222c may be formed. The second functional layer 222c may be a single layer or multiple layers. The second functional layer 222c may include an electron transport layer (ETL) and/or an electron injection layer (EIL). For example, the intermediate layer 222 may include at least one of a hole transport layer (HTL), a hole injection layer (HIL), an electron injection layer (EIL), or an electron transport layer (ETL).

The emission layer 222b of the intermediate layer 222 may be arranged in each pixel in the second area A2. The emission layer 222b may be arranged to overlap the opening OP of the pixel defining layer 215 and/or the pixel electrode 221. Each of the first and second functional layers 222a and 222c of the intermediate layer 222 is a continuous layer as a single body, and accordingly may be formed not only in the second area A2 but also in the third area A3, while the emission layer 222b is formed only in the second area A2.

The opposite electrode 223 may include a conductive material having a low work function. For example, the opposite electrode 223 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 223 may further include a layer formed of, such as, for example, indium tin oxide (ITO), indium zinc oxide (IZO), zinc oxide (ZnO), or indium oxide ($In_2O_3$), on the (semi)transparent layer including any of the above-described materials. The opposite electrode 223, which is a continuous layer as a single body, may be formed in the second area A2 to cover a plurality of pixel electrodes 221, and may also be formed in the third area A3. The intermediate layer 222 and the opposite electrode 223 may be formed via thermal deposition.

A capping layer 230 may be located on the opposite electrode 223. The capping layer 230 may include lithium fluoride (LiF), an inorganic material, and/or an organic material. According to an exemplary embodiment of the present disclosure, the capping layer 230 may be omitted.

As shown in FIGS. 9A and 10, the third spacers SPC3 may be formed on the pixel defining layer 215 in the second area A2. The third spacers SPC3 may include an organic insulating material such as polyimide (PI). Alternatively, the third spacers SPC3 may include an inorganic insulating material such as, for example, silicon nitride ($Si_3N_4$) or silicon oxide ($SiO_2$), or may include an inorganic insulating material and an organic insulating material. The third spacers SPC3 may include a material different from that included in the pixel defining layer 215. Alternatively, the third spacers SPC3 may include a material the same as that included in the pixel defining layer 215. In this case, the pixel defining layer 215 and the third spacers SPC3 may be formed together through a photolithographic process using a halftone mask or the like. According to an exemplary embodiment of the present disclosure, the pixel defining layer 215 and the third spacers SPC3 may include polyimide (PI).

The plurality of third spacers SPC3 may be arranged at regular intervals in a non-light-emission area NEA located between the light-emission areas EA. Display elements such as the organic light-emitting diodes OLED may be formed in the light-emission areas EA. The light-emission areas EA may include first light-emission areas EA1 emitting light of a first color, second light-emission areas EA2 emitting light of a second color, and third light-emission areas EA3 emitting light of a third color. The light-emission areas EA may emit, for example, red light, green light, blue light, or white light. In FIG. 9A, the light-emission areas EA form a pentile arrangement. However, according to an exemplary embodiment of the present disclosure, the light-emission areas EA may be arranged in various layouts, such as, for example, a stripe arrangement and/or a mosaic arrangement. Each first light-emission area EA1 may overlap a portion of a first pixel electrode 221a exposed via the opening OP of the pixel defining layer 215. Each second light-emission area EA2 may overlap a portion of a second pixel electrode 221b exposed via the opening OP of the pixel defining layer 215. Each third light-emission area EA3 may overlap a portion of a third pixel electrode 221c exposed via the opening OP of the pixel defining layer 215.

The third spacers SPC3 may be arranged between second pixel electrodes 221b arranged in the x direction, and/or may be arranged between first pixel electrodes 221a and third pixel electrodes 221c alternating with each other in the y direction. In other words, the third spacers SPC3 may be arranged in portions of the non-light-emission area NEA between the second light-emission areas EA2 arranged in the x direction, and/or between the first light-emission areas EA1 and the third light-emission areas EA3 alternating with each other in the y direction. For example, the third spacers SPC3 may be arranged in portions of the non-light-emission area NEA between the plurality of display elements such as the organic light-emitting diodes OLED which may emit, for example, red light, green light, or blue light, or may emit red light, green light, blue light, or white light. In FIG. 9A, each of the third spacers SPC3 is rectangular and is larger than each of the second light-emission areas EA2. However, this is merely an example. The location, shape, and size of each of the third spacers SPC3 may depend on the layout, shape, and size of each of the light-emission areas EA. For example, the third spacers SPC3 may be arranged in portions of the non-light-emission area NEA between the second light-emission areas EA2 arranged in the y direction, and/or between the first light-emission areas EA1 and the third light-emission areas EA3 alternating with each other in the x direction. The third spacers SPC3 may each be polygonal and/or circular, such as, for example, square, circular, triangular, or oval, and may each have a size smaller than that of the second light-emission areas EA2 or the same as that of the second light-emission areas EA2.

As shown in FIG. 8, there may be the first area A1 disposed between pixels which include, for example, light-emitting diodes, which are display elements, each including a stack of the pixel electrode 221, the emission layer 222b, and the opposite electrode 223. The opposite electrode 223 faces the pixel electrode 221, and the emission layer 222b is disposed between the pixel electrode 221 and the opposite electrode 223. The display layer 200 may include the fourth hole 200H located in the first area A1.

The fourth hole 200H may be formed while the through holes respectively formed in the insulating layers of the display layer 200 overlap each other. The insulating layers of the display layer 200, for example, the buffer layer 201, the gate insulating layer 203, the first interlayer insulating layer 205, the second interlayer insulating layer 207, the first organic insulating layer 209, the second organic insulating layer 211, and the pixel defining layer 215, may include through holes located in the first area A1, respectively. The size of the fourth hole 200H may be defined by an insulating layer defining a smallest hole from among the insulating layers of the display layer 200. According to an exemplary embodiment of the present disclosure, FIG. 8 illustrates that the fourth hole 200H is defined by the size of the through hole of the buffer layer 201.

Moreover, a fifth hole 5H may be formed by overlapping of through holes respectively formed in the first functional layer 222a, the second functional layer 222c, the opposite electrode 223, and the capping layer 230 corresponding to the first area A1, and the size of the fifth hole 5H may be defined by a smallest through hole of these layers. According to an exemplary embodiment of the present disclosure, FIG. 8 illustrates that the fifth hole 5H is defined by the size of the through hole of the first functional layer 222a. In this case, a width W2 (diameter) of the fifth hole 5H may be greater than a width W1 (diameter) of the fourth hole 200H.

Respective third portions SL-D of a plurality of scan lines SL arranged in the third area A3 may be located between the gate insulating layer 203 and the first interlayer insulating layer 205. Respective third portions DL-D of a plurality of data lines DL arranged in the third area A3 may be located between the second interlayer insulating layer 207 and the first organic insulating layer 209. According to an exemplary embodiment of the present disclosure, the respective third portions SL-D of the plurality of scan lines SL and/or the respective third portions DL-D of the plurality of data lines DL may be located between the first interlayer insulating layer 205 and the second interlayer insulating layer 207.

The first spacers SPC1 may surround the first area A1 and may be arranged at regular intervals in the third area A3. For example, the first spacers SPC1 may be located on the insulating layers or the pixel defining layer 215 in the third area A3, each having an island shape, and arranged around the fourth hole 200H (or the through holes respectively formed in the insulating layers of the display layer 200) along the circumference of the fourth hole 200H. As shown in FIG. 9B, the first spacers SPC1 may be arranged at regular intervals in the x direction and/or in the y direction. Although FIG. 9B illustrates the first spacers SPC1 each having a rectangular shape, this is merely an example. For example, each of the first spacers SPC1 may be polygonal and/or circular such as, for example, square, circular, triangular, or oval. According to an exemplary embodiment of the present disclosure, the layout direction of the first spacers SPC1 and the shape and size of each of the first spacers SPC1 may be the same as those of the third spacers SPC3. According to an exemplary embodiment of the present disclosure, at least one of the layout direction of the first spacers SPC1 and the shape and size of each of the first spacers SPC1 may be different from that of the third spacers SPC3. Intervals between the first spacers SPC1 in the x direction and the y direction may be the same as or different from those for the third spacers SPC3. For example, the intervals between the first spacers SPC1 in the x direction and the y direction may be less than those for the third spacers SPC3.

The first spacers SPC1 may include an organic insulating material such as polyimide (PI). Alternatively, the first spacers SPC1 may include an inorganic insulating material such as, for example, silicon nitride ($Si_3N_4$) or silicon oxide ($SiO_2$), or may include an inorganic insulating material and an organic insulating material. The first spacers SPC1 may include a material different from that included in the pixel defining layer 215. Alternatively, the first spacers SPC1 may include a material the same as that included in the pixel defining layer 215. In this case, the pixel defining layer 215 and the first spacers SPC1 may be formed together through a photolithographic process using a halftone mask or the like. According to an exemplary embodiment of the present disclosure, the pixel defining layer 215 and the first spacers SPC1 may include polyimide (PI). The first spacers SPC1 may include a material different from that included in the third spacers SPC3. Alternatively, the first spacers SPC1 may include a material the same as that included in the third spacers SPC3. In this case, the first spacers SPC1 and the third spacers SPC3 may be formed simultaneously in the same process.

The first functional layer 222a, the second functional layer 222c, the opposite electrode 223, and the capping layer 230 may cover the first spacers SPC1, gaps between the first spacers SPC1, the third spacers SPC3, and gaps between the third spacers SPC3. For example, the first functional layer 222a, the second functional layer 222c, the opposite electrode 223, and the capping layer 230 may extend from the second area A2 to the third area A3 to cover both the third spacers SPC3 and the first spacers SPC1. Thus, when the pixel electrode 221 is referred to as the first electrode and the opposite electrode 223 is referred to as the second electrode, the second electrode may face the first electrode in the display area (e.g., the second area A2), and may cover the pixel defining layer 215 and the plurality of first spacers SPC1 in the non-display area (e.g., the third area A3).

The first spacers SPC1 and the third spacers SPC3 may have the same heights, and may maintain a gap between the substrate 100 and the encapsulation member 300 in each of the second area A2 and the third area A3. For example, the first spacers SPC1 and the third spacers SPC3 may function to maintain a gap between the substrate 100 and the encapsulation member 300, and at the same time may support the encapsulation member 300.

The encapsulation member 300 is arranged to face the substrate 100. In the first area A1, the materials included in the display layer 200 are not arranged between the lower surface of the encapsulation member 300 and the upper surface of the substrate 100. In other words, in the first area A1, the upper surface of the substrate 100 may directly face the lower surface of the encapsulation member 300. The encapsulation member 300 may include a material the same as that of the substrate 100, and may have a refractive index the same as that of the substrate 100. For example, each of the substrate 100 and the encapsulation member 300 may have a refractive index of about 1.3 to about 1.7, for example, a refractive index of about 1.5. For example, the encapsulation member 300 may be an encapsulation substrate facing the substrate 100. Thus, when the substrate 100 is referred to as the first substrate, the encapsulation member 300 may be referred to as the second substrate. An air gap may be formed in the first area A1 by the substrate 100 and the encapsulation member 300.

As shown in FIG. 11, the encapsulation member 300 may include a trench TR formed on a first surface 300a facing the substrate 100. The trench TR may be dented from the first surface 300a of the encapsulation member 300 in a direction away from the substrate 100. The trench TR may be located to correspond to at least the first area A1, and may have a width W3 that is greater than a width W1 of the first area A1. The trench TR of the encapsulation member 300 may have a width W3 not overlapping the first spacers SPC1. For example, the encapsulation member 300 in the dented area (the trench TR) does not overlap the first spacers SPC1. In other words, the width W3 of the trench TR may be less than the width W2 of the fifth hole 5H. Because the encapsulation member 300 includes the trench TR at a location corresponding to the first area A1, transmittance of the first area A1 may enhance. For example, when the encapsulation member 300 is thinner, the transmittance of light may be higher.

In FIG. 8, the upper surface of the capping layer 230 directly contacts the encapsulation member 300. However, according to an exemplary embodiment of the present disclosure, as shown in FIG. 12, the upper surface of the capping layer 230 may not contact the encapsulation member 300 and may be spaced a certain distance apart from each other. In this case, the encapsulation member 300 may be spaced apart from the display layer 200 and/or the substrate 100 by a predetermined gap, and the gap may be mainly maintained by the sealant ST.

As shown in FIG. 13, dummy layers DM may be further arranged in the third area A3. The dummy layers DM may be arranged in the gaps between the first spacers SPC1 and may include a light-emitting material. The dummy layers DM may be located between the first functional layer 222a and the second functional layer 222c each extending from the second area A2 to the third area A3.

Figure 14:
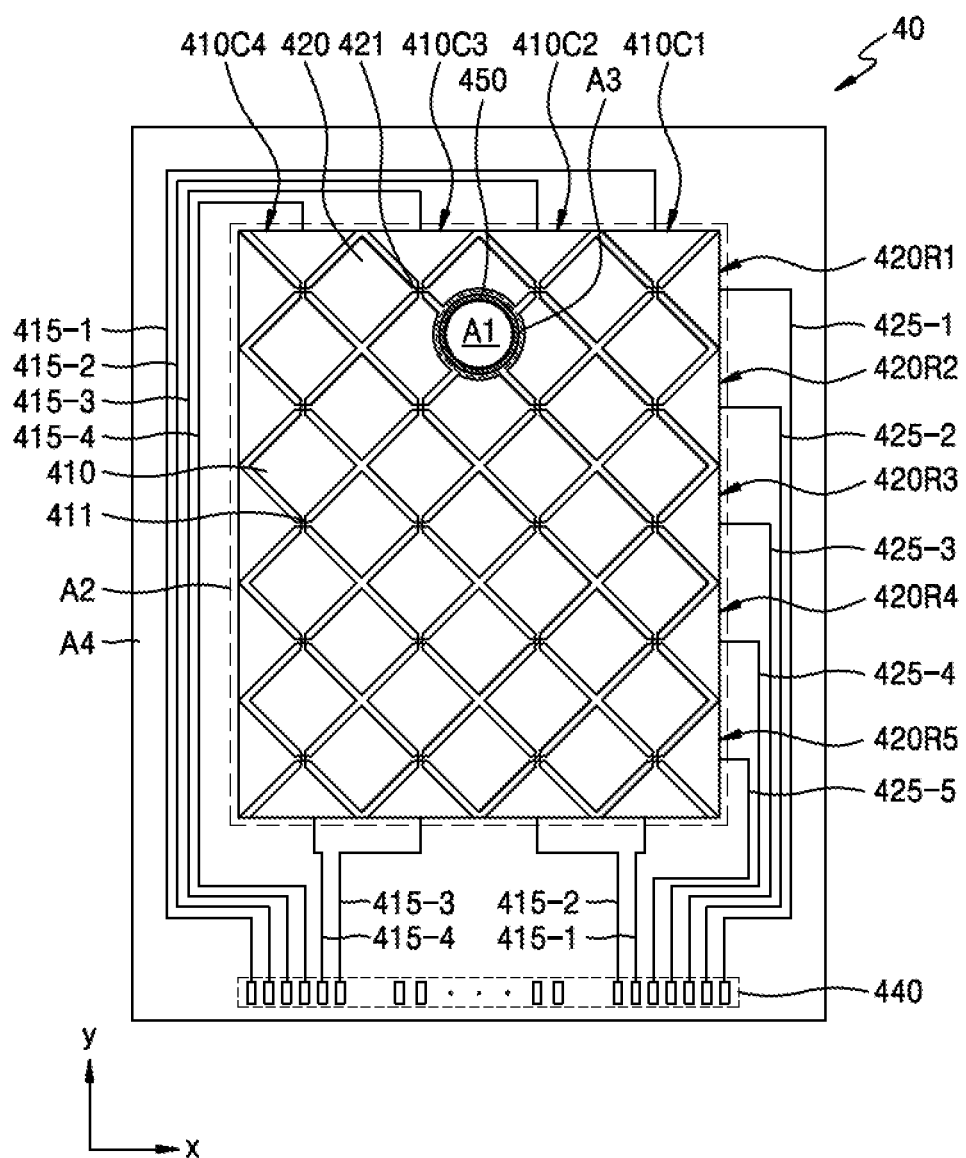
FIG. 14 is a schematic plan view of an input sensing layer on a display panel according to an exemplary embodiment of the present disclosure.

FIG. 14 is a schematic plan view of the input sensing layer 40 on a display panel according to an exemplary embodiment of the present disclosure.

Referring to FIG. 14, the input sensing layer 40 may include first sensing electrodes 410, first trace lines 415-1 through 415-4 connected to the first sensing electrodes 410, second sensing electrodes 420, and second trace lines 425-1 through 425-5 connected to the second sensing electrodes 420. The first sensing electrodes 410 and the second sensing electrodes 420 may be arranged in the second area A2, and the first trace lines 415-1 through 415-4 and the second trace lines 425-1 through 425-5 may be arranged in the fourth area A4.

The first sensing electrodes 410 may be arranged in the y direction and the second sensing electrodes 420 may be arranged in the x direction crossing the y direction. The first sensing electrodes 410 arranged in the y direction may be connected to each other via a first connecting electrode 411 disposed therebetween, and may form first sensing lines 410C1 through 410C4 extending in the y direction. The second sensing electrodes 420 arranged in the x direction may be connected to each other via a second connecting electrode 421 disposed therebetween, and may form second sensing lines 420R1 through 420R5 extending in the x direction. The first sensing lines 410C1 through 410C4 and the second sensing lines 420R1 through 420R5 may cross each other. For example, the first sensing lines 410C1 through 410C4 may be perpendicular to the second sensing lines 420R1 through 420R5. As shown in FIG. 14, the first sensing lines 410C1 through 410C4 are longer than the second sensing lines 420R1 through 420R5 as an example.

The first sensing lines 410C1 through 410C4 may be connected to pads of a sensing signal pad unit 440 through the first trace lines 415-1 through 415-4 provided in the fourth area A4. For example, the first trace lines 415-1 through 415-4 may have a double routing structure in which they are connected to each of a top and a bottom of the first sensing lines 410C1 through 410C4. The first trace lines 415-1 through 415-4 connected to the top and bottom of the first sensing lines 410C1 through 410C4 may be connected to corresponding pads, respectively. For example, the first trace lines 415-1 through 415-4 are respectively connected to both ends of the first sensing lines 410C1 through 410C4.

The second sensing lines 420R1 through 420R5 may be connected to pads of the sensing signal pad unit 440 through the second trace lines 425-1 through 425-5 provided in the fourth area A4. For example, the second trace lines 425-1 through 425-5 may be connected to corresponding pads, respectively. For example, the second trace lines 425-1 through 425-5 are respectively connected to one ends of the second sensing lines 420R1 through 420R5.

The first area A1 is an area where a component may be arranged, as described above with reference to FIGS. 2A and 2B. Thus, no sensing electrodes are arranged in the first area A1. A metal layer 450 may be arranged in the vicinity of the first area A1, for example, in the third area A3, and will be described later.

FIG. 14 illustrates a double routing structure in which the first trace lines 415-1 through 415-4 are connected to each of the top and bottom of the first sensing lines 410C1 through 410C4. This double routing structure may increase sensing sensitivity. Since the first sensing lines 410C1 through 410C4 are longer than the second sensing lines 420R1 through 420R5, a voltage drop of a detection signal (or a transmission signal) occurs and thus sensing sensitivity may be reduced. According to the present exemplary embodiment, a detection signal (or a transmission signal) is provided through the first trace lines 415-1 through 415-4 connected to two opposite ends of the first sensing lines 410C1 through 410C4, a voltage drop of a detection signal (or a transmission signal) may be prevented and thus reduction of sensing sensitivity may be prevented. According to an exemplary embodiment of the present disclosure, the first trace lines 415-1 through 415-4 may have a single routing structure in which they are connected to the top or bottom of the first sensing lines 410C1 through 410C4.

Figure 15:
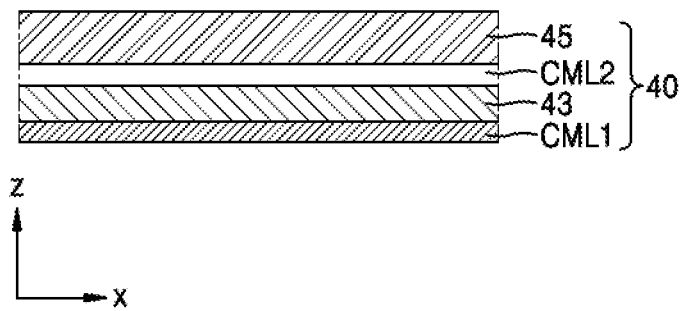
FIG. 15 is a cross-sectional view of a stacking structure of an input sensing layer according to an exemplary embodiment of the present disclosure.

FIG. 15 is a cross-sectional view of a stacking structure of the input sensing layer 40 according to an exemplary embodiment of the present disclosure.

Referring to FIG. 15, the input sensing layer 40 may include a first conductive layer CML1 and a second conductive layer CML2. A first insulating layer 43 may be provided between the first conductive layer CML1 and the second conductive layer CML2, and a second insulating layer 45 may be provided on the second conductive layer CML2.

The first and second conductive layers CML1 and CML2 may include, for example, a metal layer and/or a transparent conductive layer. The metal layer may include, for example, molybdenum (Mo), mendelevium (Mv), silver (Ag), titanium (Ti), copper (Cu), aluminum (Al), or an alloy thereof. The transparent conductive layer may include a transparent conductive oxide such as, for example, indium tin oxide (ITO), indium zinc oxide (IZO), zinc oxide (ZnO), or indium tin zinc oxide (ITZO). Alternatively, the transparent conductive layer may include a conductive polymer (e.g., poly (3,4-ethylenedioxythiophene) (PEDOT)), metal nano wires, graphene, or the like.

The first and second conductive layers CML1 and CML2 may be single layers or multi-layers. When the first and second conductive layers CML1 and CML2 are single layers, they may each include a metal layer or a transparent conductive layer, and materials of the metal layer and the transparent conductive layer may be as described above. The first or second conductive layer CML1 or CML2 may include a single metal layer. The first or second conductive layer CML1 or CML2 may include a multi-layered metal layer. The multi-layered metal layer may include, for example, three layers of a Ti layer/an Al layer/a Ti layer, or two layers of a Mo layer/a Mv layer. Alternatively, the multi-layered metal layer may include a metal layer and a transparent conductive layer. The first and second conductive layers CML1 and CML2 may have different stacking structures from each other or may have an identical stacking structure. For example, the first conductive layer CML1 may include a metal layer and the second conductive layer CML2 may include a transparent conductive layer. Alternatively, the first and second conductive layers CML1 and CML2 may include the same metal layers.

Materials of the first and second conductive layers CML1 and CML2, and layouts of sensing electrodes included in the first and second conductive layers CML1 and CML2 may be determined by taking into account the sensing sensitivity. A resistive-capacitive (RC) delay may affect sensing sensitivity. Because sensing electrodes including a metal layer have less resistance than those including a transparent conductive layer, an RC value may be reduced. Accordingly, a charging time period of a capacitor defined between the sensing electrodes may be reduced. The sensing electrodes including a transparent conductive layer are not visually recognized by a user, compared with those including a metal layer, and an input area may be increased, thereby increasing capacitance. To prevent the sensing electrodes including the metal layer from being viewed by a user, the sensing electrodes including the metal layer may have a mesh shape. The mesh-shaped sensing electrodes may increase flexibility and reduce noise on the display panel.

Each of the first and second insulating layers 43 and 45 may include an inorganic insulative material and/or an organic insulative material. The inorganic insulative material may include, for example, silicon oxide (SiO$_2$), silicon nitride (Si$_3$N$_4$), or silicon oxynitride (SiON), and the organic insulative material may include an organic polymer material.

The first sensing electrodes 410, the first connecting electrodes 411, the second sensing electrodes 420, and the second connecting electrodes 421 described above with reference to FIG. 14 may each be included in the first conductive layer CML1 or the second conductive layer CML2.

According to an exemplary embodiment of the present disclosure, the first conductive layer CML1 may include the first connecting electrodes 411, and the second conductive layer CML2 may include the first and second sensing electrodes 410 and 420 and the second connecting electrodes 421. According to an exemplary embodiment of the present disclosure, the first conductive layer CML1 may include the first and second sensing electrodes 410 and 420 and the second connecting electrodes 421, and the second conductive layer CML2 may include the first connecting electrodes 411. According to an exemplary embodiment of the present disclosure, the first conductive layer CML1 may include the first sensing electrodes 410 and the first connecting electrodes 411, and the second conductive layer CML2 may include the second sensing electrodes 420 and the second connecting electrodes 421. In this case, the first sensing electrodes 410 and the first connecting electrodes 411 are included on the same layer and integrally formed with each other, and the second sensing electrodes 420 and the second connecting electrodes 421 are also included on the same layer. Thus, an insulating layer between the first conductive layer CML1 and the second conductive layer CML2 may include no contact holes. For example, the first sensing electrodes 410 connected with the first connecting electrodes 411 are insulated from (e.g., not in contact with) the second sensing electrodes 420 connected with the second connecting electrodes 421 formed on the first insulating layers 43, while crossing the second sensing electrodes 420 and the second connecting electrodes 421.

FIG. 15 illustrates that the input sensing layer 40 includes the first conductive layer CML1, the first insulating layer 43, the second conductive layer CML2, and the second insulating layer 45. However, according to an exemplary embodiment of the present disclosure, a buffer layer including an inorganic insulative material or an organic insulative material may be further arranged below the first conductive layer CML1.

Figure 16:
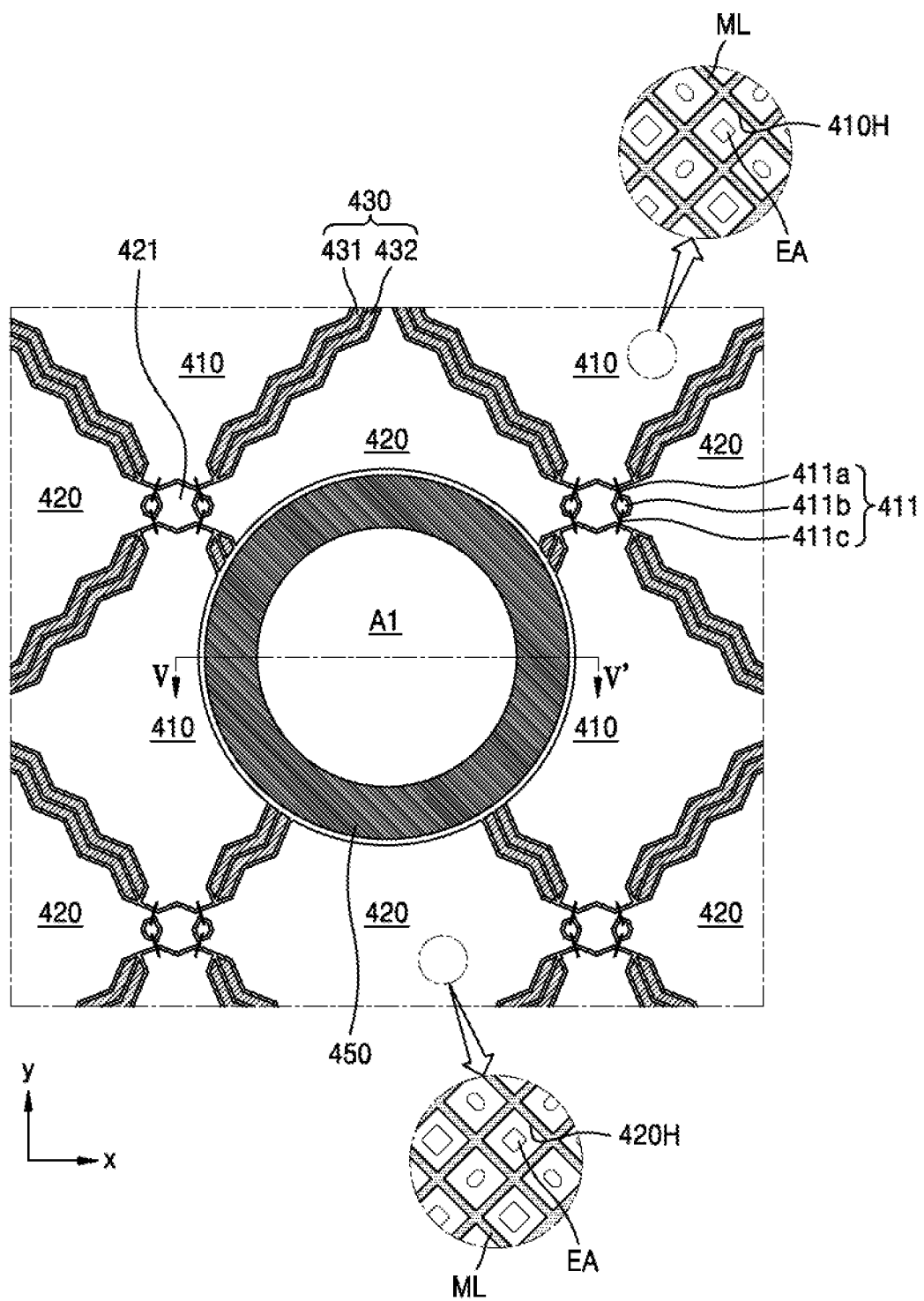
FIG. 16 is a plan view of a portion of a display device according to an exemplary embodiment of the present disclosure.

FIG. 16 is a plan view of a portion of a display device according to an exemplary embodiment of the present disclosure.

Referring to FIG. 16, the first sensing electrodes 410 may be arranged in the y direction, and the second sensing electrodes 420 may be arranged in the x direction. Neighboring second sensing electrodes 420 may be connected to each other through a second connecting electrode 421 located therebetween. Neighboring first sensing electrodes 410 may be connected to each other through a first connecting electrode 411. The first and second sensing electrodes 410 and 420 and the first and second connecting electrodes 411 and 421 may have a mesh (or grid or lattice) shape. When the first and second sensing electrodes 410 and 420 include a metal layer, the first and second sensing electrodes 410 and 420 may have a mesh shape to prevent visibility to a user and/or to transmit the light emitted from a light-emitting diode of each pixel. As shown in the magnified views of FIG. 16, the first and second sensing electrodes 410 and 420 may be mesh-shaped metal layers respectively including holes 410H and 420H. The holes 410H and 420H may be arranged to overlap the light-emission areas EA of pixels. In other words, respective mesh lines ML of the first and second sensing electrodes 410 and 420 may be located to correspond to the non-light-emission area NEA. As illustrated in FIG. 9A, the light-emission areas EA may include first light-emission areas EA1 emitting light of a first color, second light-emission areas EA2 emitting light of a second color, and third light-emission areas EA3 emitting light of a third color. The light-emission areas EA may emit, for example, red light, green light, blue light, or white light. The first and second connecting electrodes 411 and 421 may include mesh-shaped metal layers, respectively. In FIG. 16, the holes 410H and 420H are illustrated as having the same shape. However, the present disclosure is not limited thereto. For example, three types of mesh holes correspond to three types of light-emission areas such as the first to third light-emission areas EA1, EA2 and EA3 may be formed.

The first connecting electrode 411 may include an island portion 411b spaced apart from the first sensing electrodes 410. The island portion 411b may be arranged within a hole formed in the second connecting electrode 421, and may be spaced apart from the second connecting electrode 421 to be electrically insulated from the second connecting electrode 421.

One of the neighboring first sensing electrodes 410 may be connected to the island portion 411b through a first bridge portion 411a, and the other first sensing electrode 410 may be connected to the island portion 411b through a second bridge portion 411c. In the first connecting electrode 411, the first bridge portion 411a, the island portion 411b, and the second bridge portion 411c may be connected to each other. According to an exemplary embodiment of the present disclosure, the island portions 411b may be arranged on the same layer as the layer on which the first sensing electrodes 410, the second sensing electrodes 420, and the second connecting electrodes 421 are arranged. For example, the second conductive layer CML2 of FIG. 15 may include the island portions 411b, the first sensing electrodes 410, the second sensing electrodes 420, and the second connecting electrodes 421. On the other hand, the first bridge portions 411a and the second bridge portions 411c may be arranged on a different layer from the layer on which the island portions 411b are arranged. For example, the first conductive layer CML1 of FIG. 15 may include the first bridge portions 411a and the second bridge portions 411c. Thus, the first bridge portion 411a, the island portion 411b, and the second bridge portion 411c may be connected to each other through contact holes formed in the first insulating layer 43.

A dummy electrode 430 may be arranged between a first sensing electrode 410 and a second sensing electrode 420 that are adjacent to each other. For example, as shown in FIG. 16, the dummy electrode 430 may include a first dummy electrode 431 and a second dummy electrode 432 each extending along an edge of the first sensing electrode 410 or the second sensing electrode 420. For example, the first dummy electrode 431 and the second dummy electrode 432 may each extend in a zigzag shape. The dummy electrode 430 may be arranged to increase sensing sensitivity, and may be a floating electrode. The dummy electrode 430 and/or the floating electrode may be electrically separated from the first sensing electrode 410 and the second sensing electrode 420.

The first sensing electrodes 410 and the second sensing electrodes 420 arranged around the first area A1 may have different shapes from the other sensing electrodes. The first sensing electrodes 410 and the second sensing electrodes 420 arranged around the first area A1 may have smaller areas than the other sensing electrodes. For example, portions of the first sensing electrodes 410 and the second sensing electrodes 420 may be removed in the first area A1.

Each of the first sensing electrodes 410 and the second sensing electrodes 420 adjacent to the first area A1 may have a round edge, and an arrangement of the respective round edges of the first sensing electrodes 410 and the second sensing electrodes 420 may have a shape that surrounds the first area A1.

The metal layer 450 may be arranged between the first area A1 and the first and second sensing electrodes 410 and 420. The first sensing electrodes 410 and the second sensing electrodes 420 may be arranged in the second area A2, which is an active area, and the metal layer 450 may be arranged in the third area A3. The metal layer 450 may function to cover the detouring wires arranged in the third area A3, for example, the third portions DL-D (see FIGS. 6B, 8 and 11-13) of the data lines DL and the third portions SL-D (see FIGS. 6B, 8 and 11-13) of the scan line SL. If no metal layers 450 are arranged and thus the detouring wires are exposed by not being covered, external light incident via the first area A1 may be reflected by detouring wires DWL of FIG. 17 and may be visually recognized, or may affect the characteristics of a component that may be arranged in the first area A1. According to an exemplary embodiment of the present disclosure, the metal layer 450 may be provided on the second substrate (e.g., the encapsulation member 300) and may overlap the plurality of first spacers SPC1 and the plurality of detouring wires DWL disposed on the first substrate (e.g., the substrate 100), with the metal layer 450 configured to prevent external light incident via the transmission area (e.g., the first area A1) from reaching the plurality of detouring wires DWL.

The metal layer 450 arranged around the first area A1, for example, in the third area A3, according to an exemplary embodiment of the present disclosure may minimize an influence of reflected light by blocking external light that travels aslant.

The metal layer 450 may surround the first area A1 and having a certain width, and may have a ring shape that surrounds the first area A1, in a plan view. The metal layer 450 may include, for example, molybdenum (Mo), mendelevium (Mv), silver (Ag), titanium (Ti), copper (Cu), aluminum (Al), or an alloy thereof. The metal layer 450 may be in a floating state where it is not electrically connected to its surrounding elements, for example, the first and second sensing electrodes 410 and 420 and the dummy electrodes 430. The metal layer 450 may overlap the first spacers SPC1 of the third area A3. According to an exemplary embodiment of the present disclosure, the metal layer 450 may be disposed in at least one of the first insulating layer 43 and the second insulating layer 45.

Figure 17:
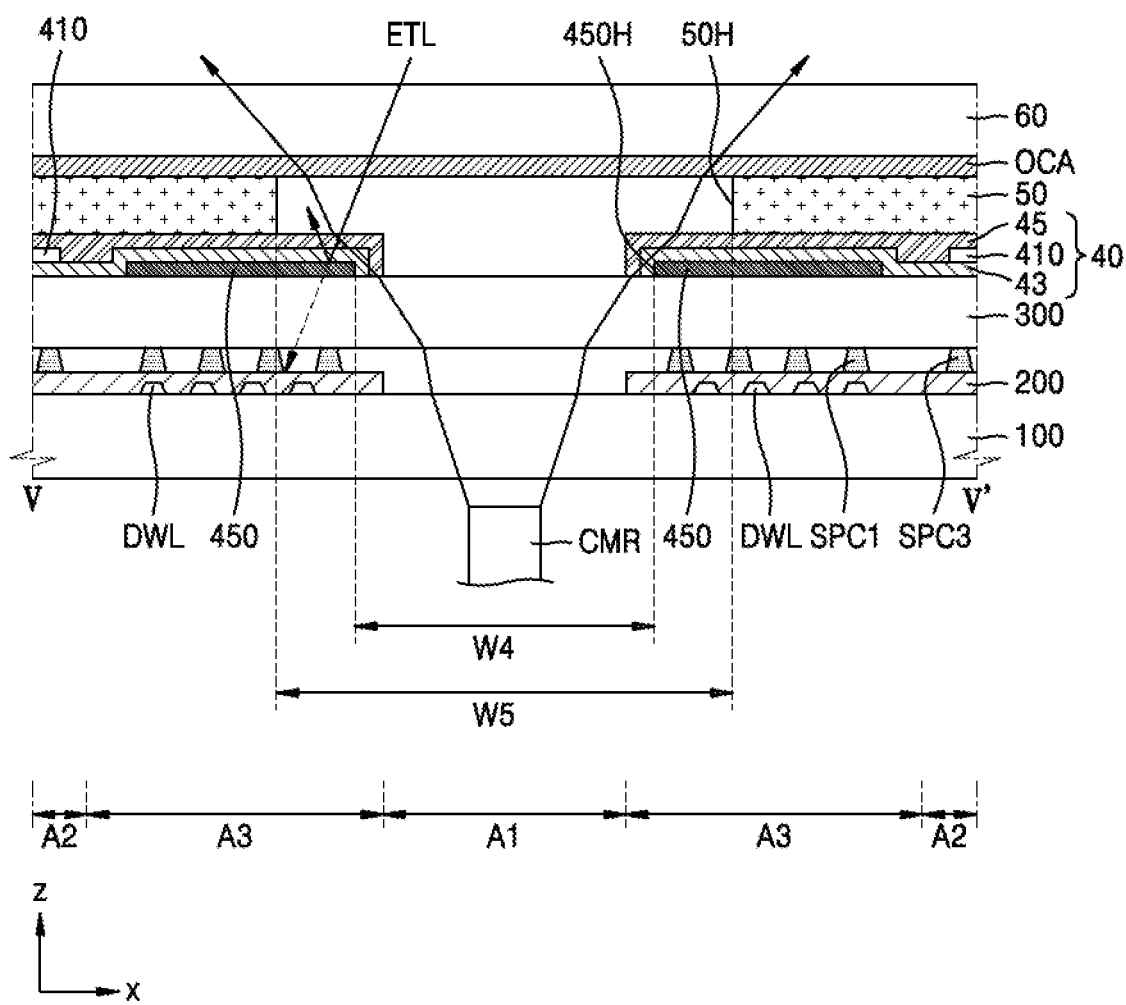
FIG. 17 is a cross-sectional view of the portion of the display device taken along line V-V' of FIG. 16, according to an exemplary embodiment of the present disclosure.

FIG. 17 is a cross-sectional view of the portion of the display device taken along line V-V' of FIG. 16, according to an exemplary embodiment of the present disclosure.

Referring to FIG. 17, the display layer 200 arranged on the substrate 100 includes a plurality of pixels, for example, organic light-emitting diodes OLED, arranged in the second area A2. The display layer 200 includes the detouring wires DWL arranged in the third area A3. The first spacers SPC1 and the third spacers SPC3 may be arranged on the display layer 200. The first spacers SPC1 may be arranged in the third area A3, and the third spacers SPC3 may be arranged in the non-light-emission area NEA of the second area A2. Some of the first spacers SPC1 may be arranged at the boundary between the third area A3 and the second area A2. Although the first spacers SPC1 and the third spacers SPC3 are arranged on the display layer 200 in FIG. 17, the first spacers SPC1 and the third spacers SPC3 may be a part of the display layer 200.

The encapsulation member 300 may be arranged to cover the display layer 200. The encapsulation member 300 is to encapsulate the display layer 200, and may be a rigid encapsulation substrate.

The metal layer 450 may be located on the encapsulation member 300, and may include a sixth hole 450H corresponding to the first area A1. The metal layer 450 may be arranged on a layer the same as the layer on which the input sensing layer 40 is arranged. The metal layer 450 may be arranged below the first sensing electrodes 410 with the first insulating layer 43 of the input sensing layer 40 located therebetween, and the first sensing electrodes 410 may be covered by the second insulating layer 45. The metal layer 450 may float from the input sensing layer 40 and thus may be electrically insulated from the input sensing layer 40. For example, the metal layer 450 may be electrically insulated from the first sensing electrodes 410 and the second sensing electrodes 420. The metal layer 450 may be arranged to overlap the detouring wires DWL and the first spacers SPC1 arranged in the third area A3 of the display layer 200.

Because the first area A1 is capable of transmitting light, a component such as a sensor or a camera CMR arranged in the first area A1 may emit light toward the outside and/or receive external light. Because light travels in various directions, external light ETL incident aslant toward the substrate 100 may travel toward the display layer 200 as indicated by a dotted line in FIG. 17 when there are no metal layers 450. However, according to an exemplary embodiment of the present disclosure, the metal layer 450 is arranged to surround the first area A1 and thus reflects the external light ETL incident aslant, thereby preventing traveling of the external light ETL toward the display layer 200.

According to the present exemplary embodiment, an edge of the sixth hole 450H may be closer to the first area A1 than a detouring wire DWL most adjacent to the first area A1 from among the detouring wires DWL. Thus, the external light ETL traveling aslant may be prevented from reaching the detouring wires DWL. If the external light ETL reaching the detouring wires DWL may be reflected by the detouring wires DWL, and thus may interfere the performance of the component such as a sensor or a camera CMR arranged in the first area A1.

The optical functional layer 50 may be located on the input sensing layer 40. The optical functional layer 50 may include the second hole 50H located corresponding to the first area A1. The optical functional layer 50 may include an external light reflection element such as a phase retarder and/or a polarizer, to prevent reflection of the external light ETL. Alternatively, the optical functional layer 50 may include an external light reflection element such as a combination of a color filter and a black matrix or a destructive interference structure, to prevent reflection of the external light ETL.

A width (diameter) W5 of the second hole 50H of the optical functional layer 50 may be greater than a width (diameter) W4 of the sixth hole 450H of the metal layer 450. Because the optical functional layer 50 is capable of preventing reflection of the external light ETL, when the second hole 50H of the optical functional layer 50 is formed to have substantially the same width as the width of the sixth hole 450H of the metal layer 450 and the camera CMR is used as the component, the optical functional layer 50 may restrict the field of view of the camera CMR (for example, a wide-angle camera). For example, in this case, only light incident from outside at a small angle can reach the camera CMR, and light incident from outside at a large angle may be blocked by the optical functional layer 50. In other words, the camera CMR may not be able to capture the light from a wide range of incident angles. The restriction of the field of view may more noticeably occur when the optical functional layer 50 includes an external light reflection component such as a relatively-thick polarizer. The restriction of the field of view may also more noticeably occur due to a process error that may be generated in a process of aligning the second hole 50H of the optical functional layer 50 with the first area A1 during the manufacture of a display device.

According to an exemplary embodiment of the present disclosure, the second hole 50H of the optical functional layer 50 is formed to have a larger width than the sixth hole 450H of the metal layer 450, thereby preventing occurrence of the above-described restriction of the field of view of the camera CMR and also preventing damage to a captured image of the camera CMR. The window 60 may be arranged on the optical functional layer 50 through the optical clear adhesive OCA.

Figure 18:
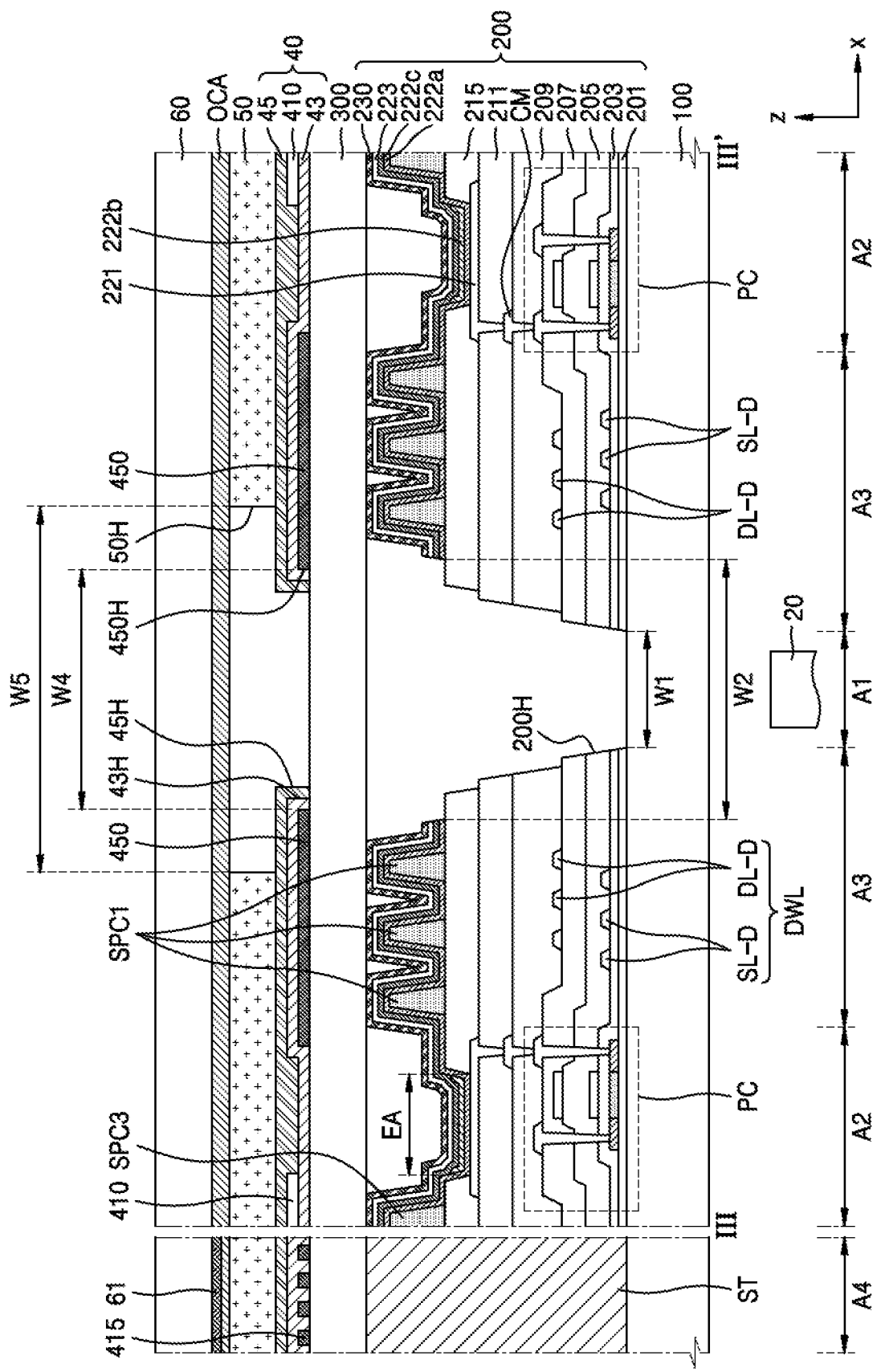
FIG. 18 is a schematic cross-sectional view of a display device according to an exemplary embodiment of the present disclosure.

FIG. 18 is a schematic cross-sectional view of a display device according to an exemplary embodiment of the present disclosure.

Referring to FIG. 18, the buffer layer 201, the gate insulating layer 203, the first interlayer insulating layer 205, the second interlayer insulating layer 207, the first organic insulating layer 209, and the second organic insulating layer 211 are arranged on the substrate 100. Each pixel circuit PC may include a thin-film transistor and a capacitor, and a semiconductor layer and electrodes of the thin-film transistor and electrodes of the capacitor may be arranged on the insulating layers described above with reference to FIGS. 8 and 10.

The pixel electrode 221 may be connected to the connecting metal electrode CM via a contact hole of the second organic insulating layer 211, and the connecting metal electrode CM may be connected to the thin-film transistor of the pixel circuit PC via a contact hole of the first organic insulating layer 209. According to an exemplary embodiment of the present disclosure, the connecting metal electrode CM may be omitted, and the pixel electrode 221 may be connected to the thin-film transistor of the pixel circuit PC via the respective contact holes of the first organic insulating layer 209 and the second organic insulating layer 211.

The pixel defining layer 215 arranged on the pixel electrode 221 may include an opening that overlaps and exposes the pixel electrode 221, and the opening of the pixel defining layer 215 may define a light-emission area EA. The first functional layer 222a, the emission layer 222b, the second functional layer 222c, the opposite electrode 223 and the capping layer 230 may be sequentially stacked on the pixel defining layer 215. The emission layer 222b may be arranged to overlap the opening of the pixel defining layer 215. The materials and features of the display layer 200 arranged on the substrate 100 are the same as those described above with reference to FIGS. 8 and 10.

In the insulating layers, the first functional layer 222a, the second functional layer 222c, the opposite electrode 223, and the capping layer 230 included in the display layer 200, reflection of external light may not occur. Here, the insulating layers are as described above with reference to FIGS. 8 and 10. The insulating layers, the first functional layer 222a, the second functional layer 222c, the opposite electrode 223, and/or the capping layer 230 included in the display layer 200 may be partially exposed by not being entirely covered by the metal layer 450.

The encapsulation member 300 may be arranged to face the substrate 100. In the first area A1, the materials included in the display layer 200 are not arranged between the lower surface of the encapsulation member 300 and the upper surface of the substrate 100. For example, an air gap may be formed in the first area A1 between the substrate 100 and the encapsulation member 300. In other words, in the first area A1, the upper surface of the substrate 100 may directly face the lower surface of the encapsulation member 300.

The metal layer 450 may be arranged in the third area A3, and may overlap the detouring wires DWL and the first spacers SPC1 arranged in the third area A3.

The metal layer 450 may directly contact the upper surface of the encapsulation member 300, and may be formed in a process of forming the input sensing layer 40, for example, a process of forming the first trace lines 415 and first connecting electrodes 411. FIG. 18 illustrates that the first trace lines 415 located in the fourth area A4 and the metal layer 450 located in the third area A3 are arranged directly on the upper surface of the encapsulation member 300. At least one of the trace lines located in the fourth area A4, for example, the first trace lines 415, may overlap the sealant ST.

The first insulating layer 43 formed of, for example, silicon nitride ($Si_3N_4$), silicon oxide ($SiO_2$), or silicon oxynitride (SiON) may be arranged on the metal layer 450. Sensing electrodes and the second insulating layer 45 may be sequentially arranged on the first insulating layer 43. The first insulating layer 43 and the second insulating layer 45 may include holes 43H and 45H, respectively, located in the first area A1.

Ends of the first insulating layer 43 may cover an inner edge of the metal layer 450, and ends of the second insulating layer 45 may cover the ends of the first insulating layer 43. The first insulating layer 43 and the second insulating layer 45 may include the same material or may include materials different from each other. Each of the first and second insulating layers 43 and 45 may include an inorganic insulative material or an organic insulative material.

FIG. 18 illustrates that the metal layer 450 is below the first insulating layer 43. The first insulating layer 43 may be located between the metal layer 450 and the first sensing electrodes 410 with the first sensing electrodes 410 not overlapping the metal layer 450, and the first sensing electrodes 410 may be covered by the second insulating layer 45. However, the present disclosure is not limited thereto. For example, according to an exemplary embodiment of the present disclosure, sensing electrodes including the first sensing electrodes 410 and second connecting electrodes may be arranged below the first insulating layer 43, trace lines may be arranged above the first insulating layer 43, and the metal layer 450 may be formed together with the trace lines when the trace lines are formed, and thus may be arranged above the first insulating layer 43.

The optical functional layer 50 may be arranged to cover a portion of the metal layer 450, and the optical clear adhesive OCA and the window 60 may be arranged on the optical functional layer 50. As shown in FIG. 2B, the optical clear adhesive OCA may include a third hole OCAH by removing a portion corresponding to the first area A1 from the optical clear adhesive OCA. A light-shielding unit 61 may be arranged on the rear surface of the window 60 to cover elements arranged in the fourth area A4, for example, the first trace lines 415. The light-shielding unit 61 covering a dead area may include a colored layer. For example, the light-shielding unit 61 may be a colored layer or colored layers printed or deposited on a rear side of the window 60 in the fourth area A4. For example, the light-shielding unit 61 may include layers of various colors such as white, black, silver, gold, and pink. The light-shielding unit 61 may have a shape of a polygonal ring or frame surrounding the second area A2. For example, the light-shielding unit 61 may have a shape of an approximately quadrilateral ring or frame.

The second hole 50H of the optical functional layer 50 may overlap the sixth hole 450H of the metal layer 450. In relation to an alignment error during assembly of the display device and/or the quality of an image captured by a camera due to the field of view of the camera when the component 20 is the camera, the width W4 of the sixth hole 450H of the metal layer 450 may be less than the width W5 of the second hole 50H of the optical functional layer 50. For example, the camera may be able to capture light incident at relatively larger angles.

Figure 19:
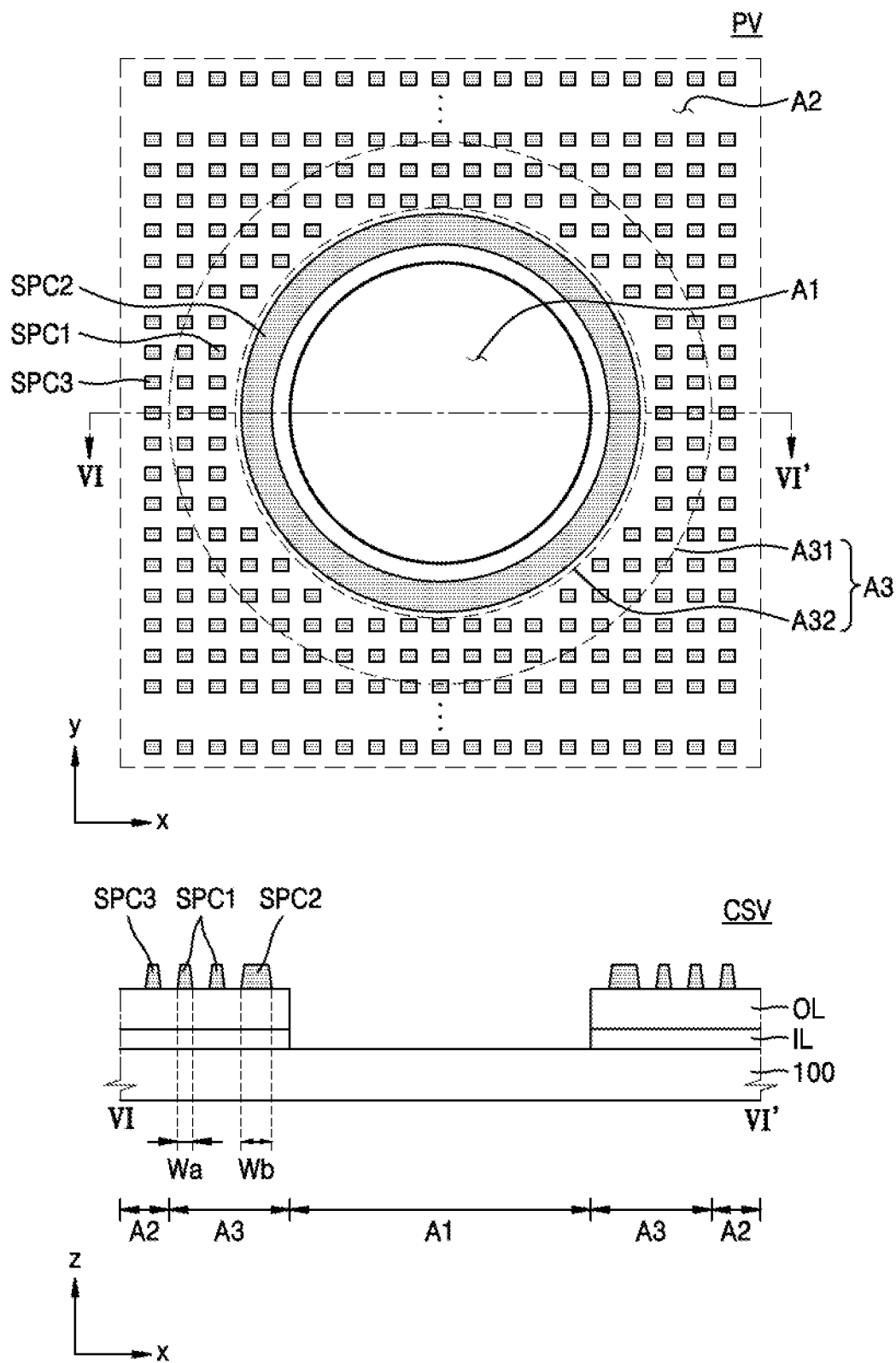
FIG. 19 schematically illustrates a portion of a display panel according to an exemplary embodiment of the present disclosure.
Figure 20:
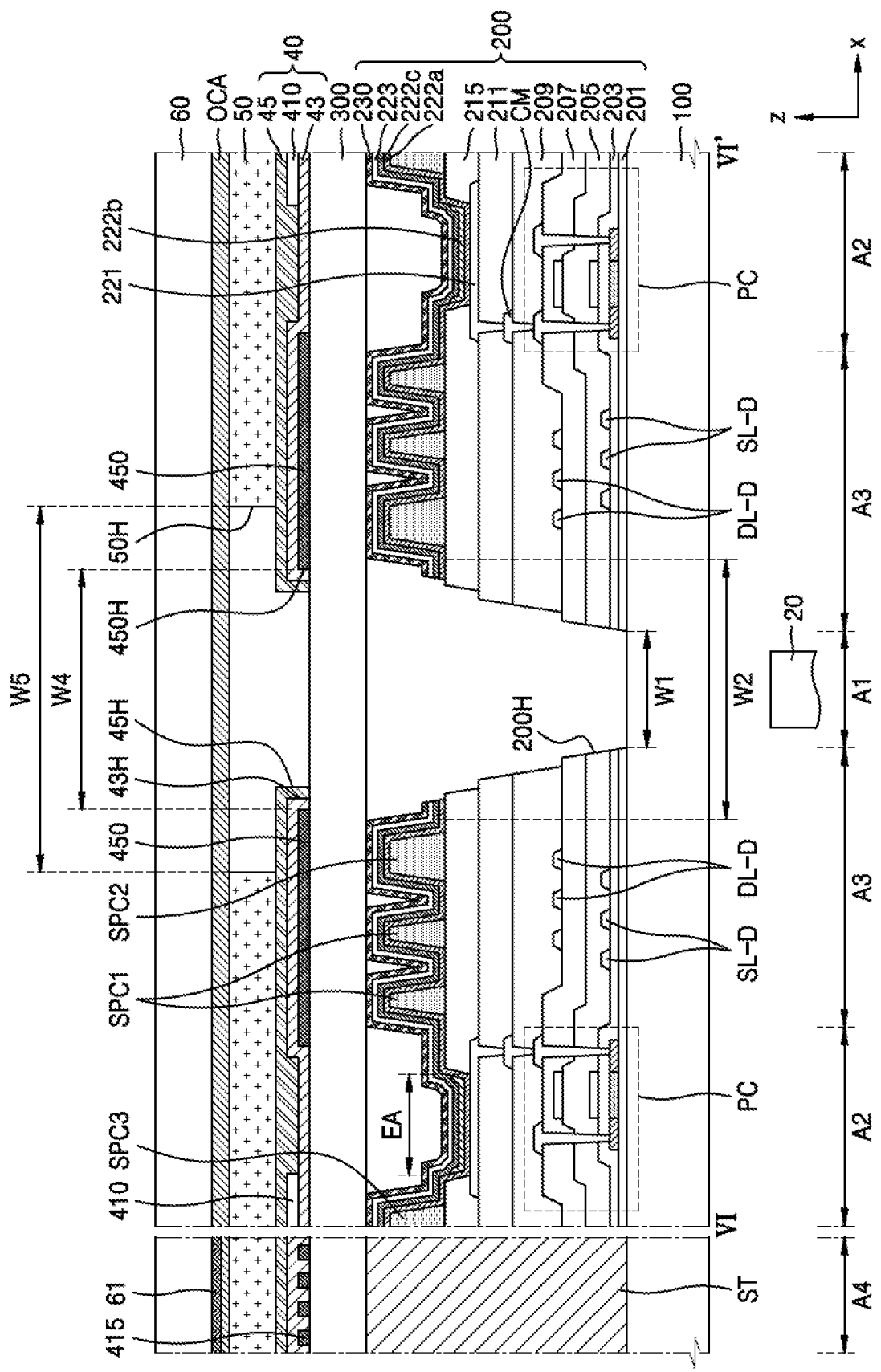
FIG. 20 is a cross-sectional view of a display device including a cross-section taken along line VI-VI' of FIG. 19.

FIG. 19 schematically illustrates a portion of a display panel according to an exemplary embodiment of the present disclosure. FIG. 20 is a cross-sectional view of a display device including a cross-section taken along line VI-VI' of FIG. 19.

FIG. 19 illustrates a portion of the display panel including the first area A1 and the third area A3 surrounding the first area A1. The cross-sectional view CSV of FIG. 19 may correspond to a cross-section taken along line VI-VI' of the plan view PV of FIG. 19.

Referring to FIG. 19, the third area A3 may include a first sub-area A31 and a second sub-area A32. The second sub-area A32 may be adjacent to the first area A1 and may surround the first area A1, and the first sub-area A31 may surround the second sub-area A32 and may be adjacent to the second area A2. A plurality of first spacers SPC1 may be arranged in the first sub-area A31, and a second spacer SPC2 may be arranged in the second sub-area A32. The first spacers SPC1 and the second spacer SPC2 may be arranged on a stack of at least one inorganic insulating layer IL and at least one organic insulating layer OL above the substrate 100. For example, as shown in FIGS. 19 (CSV) and 20, the at least one organic insulating layer OL is formed on the at least one inorganic insulating layer IL.

The first spacers SPC1 may be island-shaped insulating patterns. The first spacers SPC1 may be arranged at regular intervals in the first sub-area A31. Some of the first spacers SPC1 may be arranged at the boundary between the second area A2 and the third area A3, and thus may be arranged in the second area A2 and the third area A3. The second spacer SPC2 may be arranged along the circular arc of the first area A1 to have a closed loop shape such as a ring shape or donut shape, within the second sub-area A32. Thus, the second spacer SPC2 may be adjacent to the first area A1, and the first spacers SPC1 may be arranged around the second spacer SPC2. The second spacer SPC2 may include a material the same as that included in the first spacers SPC1. According to an exemplary embodiment of the present disclosure, the second spacer SPC2 may include a material different from that included in the first spacers SPC1. According to an exemplary embodiment of the present disclosure, the second spacer SPC2 may include an organic insulative material. A width Wb of the second spacer SPC2 in the x direction may be greater than a width Wa of each of the first spacers SPC1 in the x direction. The first spacers SPC1, the second spacer SPC2 and the third spacers SPC3 may function to maintain a gap between the substrate 100 and the encapsulation member 300 and to support the encapsulation member 300, and the second spacer SPC2 may function to separate the first area A1 from the second area A2 to prevent a foreign material such as, for example, oxygen, moisture, or the like introduced via the first area A1 from penetrating into the display area (the second area A2) to degrade the performance of the display elements. The metal layer 450 may be located on the encapsulation member 300, and may overlap the detouring wires DWL, the first spacers SPC1 and the second spacers SPC2 arranged in the third area A3.

FIGS. 19 and 20 illustrate an example in which a single second spacer SPC2 is included. According to an exemplary embodiment of the present disclosure, two or more second spacers SPC2 may be spaced apart from each other by a predetermined distance. A second spacer SPC2 farther from the first area A1 may surround a second spacer SPC2 closer to the first area A1. The two or more second spacers SPC2 may have the same widths or widths different from each other. In this case, the number of second spacers SPC2 may be determined to prevent the size of the third area A3 from excessively increasing, and the number of first spacers SPC1 arranged in the third area A3 may be reduced.

According to the exemplary embodiment of FIGS. 19 and 20, an island-shaped spacer and a ring-shaped spacer are arranged together in the third area A3, so that the encapsulation member 300 may be more uniformly supported and thus sagging and/or breakage of the encapsulation member 300 may be effectively prevented. The other components are the same as those described above with reference to FIGS. 7 through 18, and thus descriptions thereof will be omitted.

The drawings of the above-described exemplary embodiments illustrate an example where the first organic insulating layer 209 and the second organic insulating layer 211 are arranged between the pixel circuit PC and the pixel electrode 221, but the present disclosure is not limited thereto. For example, according to an exemplary embodiment of the present disclosure, a single organic insulating layer corresponding to the first organic insulating layer 209 and/or the second organic insulating layer 211 may be arranged between the pixel circuit PC and the pixel electrode 221, and the connecting metal electrode CM may be omitted. In this case, the pixel electrode 221 may contact the thin-film transistor TFT of the pixel circuit PC via a contact hole of the single organic insulating layer and thus may be electrically connected thereto.

According to an exemplary embodiment of the present disclosure, a transmission area of a display device including the transmission area in a display area may not be visually recognized, and the display device may be prevented from being damaged. These effects are only examples, and the present disclosure is not limited thereto.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments. While specific exemplary embodiments have been described with reference to the figures, it will be understood by those of ordinary skill in the art that various changes in form and details may be made therein without departing from the spirit and scope of the present disclosure as defined by the appended claims.

What is claimed is:

1. A display device comprising:
a first substrate comprising a transmission area, a display area surrounding at least a portion of the transmission area, and a first non-display area located between the transmission area and the display area;
an insulating layer arranged on the first substrate in the display area and the first non-display area;
a plurality of display elements disposed on the insulating layer in the display area;
a plurality of first spacers each having an island shape and spaced apart from each other on the insulating layer in the first non-display area, the plurality of first spacers being arranged at intervals in a first direction or a second direction in a plan view; and
a second substrate facing the first substrate.

2. The display device of claim 1, wherein the insulating layer comprises at least one inorganic insulating layer and at least one organic insulating layer, and
the at least one organic insulating layer is on the at least one inorganic insulating layer.

3. The display device of claim 2, wherein each of the display elements comprises a first electrode, a second electrode facing the first electrode, and an emission layer disposed between the first electrode and the second electrode, and
a pixel defining layer located between the first electrodes of the display elements is arranged on the at least one organic insulating layer.

4. The display device of claim 3, wherein the plurality of first spacers are on the pixel defining layer arranged in the first non-display area.

5. The display device of claim 3, wherein the second electrode covers the pixel defining layer and the plurality of first spacers.

6. The display device of claim 1, wherein the plurality of first spacers comprise an organic insulative material.

7. The display device of claim 1, further comprising a second spacer arranged on the insulating layer in the first non-display area and having a ring shape that surrounds the transmission area.

8. The display device of claim 7, wherein the second spacer is adjacent to the transmission area, and
the plurality of first spacers are arranged around the second spacer.

9. The display device of claim 7, wherein the second spacer comprises an organic insulative material.

10. The display device of claim 1, further comprising a plurality of third spacers located on the insulating layer in the display area, each having an island shape, and arranged between the plurality of display elements.

11. The display device of claim 1, further comprising a sealant coupling the first substrate to the second substrate and arranged on the first substrate in a second non-display area that surrounds the display area.

12. The display device of claim 1, further comprising a metal layer provided on the second substrate and overlapping the plurality of first spacers.

13. The display device of claim 1, wherein the second substrate has a trench located to correspond to the transmission area, and
the trench is formed as a dented area of the second substrate on a surface that faces the first substrate.

14. A display device comprising:
a first substrate comprising a transmission area, a display area surrounding at least a portion of the transmission area, and a first non-display area located between the transmission area and the display area;
a first electrode arranged in the display area on the first substrate;
an insulating layer arranged in the display area and the first non-display area on the first substrate and comprising an opening exposing a portion of the first electrode in the display area and comprising a through hole corresponding to the transmission area;
a plurality of first spacers located on the insulating layer in the first non-display area, each having an island shape, and arranged around the through hole along a circumference of the through hole;
an emission layer disposed within the opening of the insulating layer; and
a second electrode facing the first electrode in the display area and covering the plurality of first spacers in the first non-display area.

15. The display device of claim 14, wherein the plurality of first spacers comprise an organic insulative material.

16. The display device of claim 14, further comprising a second spacer arranged on the insulating layer in the first non-display area and having a ring shape that surrounds the transmission area, wherein the second spacer is between the through hole and the plurality of first spacers.

17. The display device of claim 16, wherein the second spacer comprises an organic insulative material.

18. The display device of claim 14, further comprising a second substrate facing the first substrate.

19. The display device of claim 18, further comprising a metal layer provided on the second substrate and overlapping the plurality of first spacers.

20. The display device of claim 18, wherein the second substrate has a trench located to correspond to the transmission area, with the trench being on a surface, that faces the first substrate, of the second substrate.

21. A display device comprising:
a first substrate comprising a transmission area, a display area surrounding at least a portion of the transmission area, and a first non-display area located between the transmission area and the display area;
an insulating layer formed on the first substrate and arranged in the display area and the first non-display area;
a plurality of detouring wires disposed in the insulating layer in the first non-display area;
a plurality of first spacers each having an island shape and spaced apart from each other on the insulating layer in the first non-display area;
a second substrate facing the first substrate; and
a metal layer provided on the second substrate and overlapping the plurality of first spacers and the plurality of detouring wires, with the metal layer configured to prevent external light incident via the transmission area from reaching the plurality of detouring wires.

22. The display device of claim 21, further comprising a trench formed as a dented area of the second substrate on a surface facing the first substrate,
wherein the trench is located to correspond to the transmission area, and does not overlap the plurality of first spacers.

* * * * *